(12) United States Patent
Bae et al.

(10) Patent No.: US 8,810,003 B2
(45) Date of Patent: Aug. 19, 2014

(54) SEMICONDUCTOR DEVICE AND METHOD OF FABRICATING THE SAME

(75) Inventors: Byoungjae Bae, Hwaseong-si (KR); Jung-in Kim, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/553,889

(22) Filed: Jul. 20, 2012

(65) Prior Publication Data

US 2013/0026439 A1 Jan. 31, 2013

(30) Foreign Application Priority Data

Jul. 25, 2011 (KR) ........................ 10-2011-0073542

(51) Int. Cl.
*H01L 29/00* (2006.01)
*H01L 45/00* (2006.01)
*H01L 27/24* (2006.01)
*H01L 27/22* (2006.01)

(52) U.S. Cl.
CPC ............ *H01L 45/06* (2013.01); *H01L 45/1675* (2013.01); *H01L 45/147* (2013.01); *H01L 45/148* (2013.01); *H01L 27/2436* (2013.01); *H01L 27/228* (2013.01); *H01L 45/1233* (2013.01); *H01L 27/2445* (2013.01); *H01L 27/224* (2013.01); *H01L 27/226* (2013.01); *H01L 45/144* (2013.01); *H01L 45/141* (2013.01); *H01L 45/146* (2013.01); *H01L 27/2409* (2013.01); *H01L 27/2472* (2013.01)
USPC .................................. 257/536; 257/E27.009

(58) Field of Classification Search
None
See application file for complete search history.

(56) References Cited

U.S. PATENT DOCUMENTS

| | | | |
|---|---|---|---|
| 2009/0134431 A1* | 5/2009 | Tabata et al. | ................... 257/210 |
| 2010/0237320 A1* | 9/2010 | Nagashima | ........................ 257/5 |
| 2011/0020998 A1 | 1/2011 | Oh et al. | |

FOREIGN PATENT DOCUMENTS

| | | |
|---|---|---|
| JP | 2009-283513 A | 3/2009 |
| KR | 10-0650724 | 11/2006 |
| KR | 10-0920051 | 9/2009 |
| KR | 10-2010-0052857 A | 5/2010 |
| KR | 10-2010-0086852 | 8/2010 |
| KR | 10-2010-0110632 A | 10/2010 |
| KR | 10-2010-0130072 A | 12/2010 |
| KR | 10-2011-009545 | 1/2011 |

* cited by examiner

*Primary Examiner* — Michael Lebentritt
*Assistant Examiner* — Kevin Quinto
(74) *Attorney, Agent, or Firm* — Stanzione & Kim, LLP

(57) ABSTRACT

Provided are semiconductor devices and methods of fabricating the same. The device may include lower interconnection lines, upper interconnection lines crossing the lower interconnection lines, selection elements disposed at intersections, respectively, of the lower and upper interconnection lines, and memory elements interposed between the selection elements and the upper interconnection lines, respectively. Each of the selection elements may be realized using a semiconductor pattern having a first sidewall, in which a first lower width is smaller than a first upper width, and a second sidewall, in which a second lower width is greater than a second upper width, the first and second sidewalls crossing each other.

14 Claims, 23 Drawing Sheets

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. §119(a) from Korean Patent Application No. 10-2011-0073542, filed on Jul. 25, 2011, in the Korean Intellectual Property Office, the entire contents of which are hereby incorporated by reference.

BACKGROUND

1. Field

The general present general inventive concepts relate to a semiconductor device, and more particularly, to a semiconductor device with a high integration density and a method of fabricating the same.

2. Description of the Related Art

Higher integration of semiconductor memory devices is required to satisfy the increasing demands of the electronic industry. A Down-scaling is an important and effective way for achieving the higher integration of semiconductor memory devices and reducing the fabricating cost.

Hole-type etching processes have been used to form holes in interlayer dielectrics of the semiconductor device, which are used by components as contact points. However, this may lead to several problems, such as a decrease in process margin and/or an increasing difficulty in optimizing all components (e.g., various driving circuits and/or memory cells) constituting the semiconductor device.

SUMMARY

Additional features and utilities of the present general inventive concept will be set forth in part in the description which follows and, in part, will be obvious from the description, or may be learned by practice of the present general inventive concept.

At least one exemplary embodiment provides a method of fabricating a semiconductor device having an increased integration density and an improved operation property.

According to example embodiments of the present general inventive concepts, a semiconductor device may include lower interconnection lines, upper interconnection lines crossing the lower interconnection lines, selection elements disposed at intersections, respectively, of the lower and upper interconnection lines, and memory elements interposed between the selection elements and the upper interconnection lines, respectively. Each of the selection elements may be realized using a semiconductor pattern having a first sidewall, in which a first lower width is smaller than a first upper width, and a second sidewall, in which a second lower width is greater than a second upper width, the first and second sidewalls crossing each other.

According to other example embodiments of the present general inventive concepts, a method of fabricating a semiconductor device may include forming mold patterns on a semiconductor substrate, the mold patterns extending along a direction to define first trenches exposing the semiconductor substrate, forming semiconductor layers to fill the first trenches, and forming second trenches crossing the mold patterns and the semiconductor layers to form semiconductor patterns two-dimensionally arranged on the semiconductor substrate.

BRIEF DESCRIPTION OF THE DRAWINGS

These and/or other features and utilities of the present general inventive concept will become apparent and more readily appreciated from the following description of the exemplary embodiments, taken in conjunction with the accompanying drawings of which.

Figure 1:
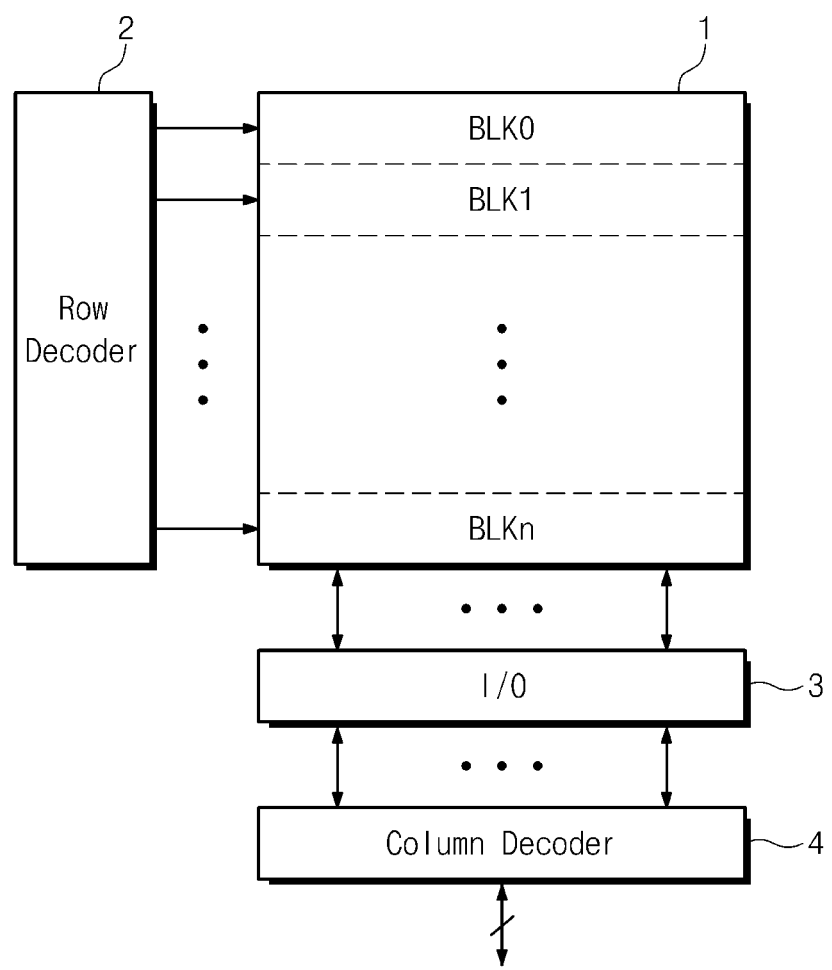
FIG. 1 is a block diagram of a semiconductor device according to example embodiments of the present general inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EXEMPLARY EMBODIMENTS

Reference will now be made in detail to exemplary embodiments of the present general inventive concept, examples of which are illustrated in the accompanying drawings, wherein like reference numerals refer to the like elements throughout. The exemplary embodiments are described below in order to explain the present general inventive concept while referring to the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the described exemplary embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the present general present general inventive concepts are described herein with reference to cross-sectional illustrations that are schematic illustrations of example embodiments. As such, variations from the shapes of the illustrations as a result, for example, of manufacturing techniques and/or tolerances, are to be expected. Thus, example embodiments of the present general inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the present general inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a phase changeable random access memory (PRAM) device will be described as an example of semiconductor devices according to example embodiments of the present general inventive concept, but example embodiments of the present general inventive concept may not be limited thereto. For example, the present general inventive concept may be used to realize other variable resistance memory devices, such as a resistive memory device (RRAM), a magnetic RAM (MRAM), and a ferroelectric RAM (FRAM). Furthermore, the present general inventive concept may be used to realize a dynamic RAM (DRAM), a static RAM (SRAM), a programmable ROM (PROM), an erasable PROM (EPROM), an electrically erasable PROM (EEPROM), a FLASH memory device.

FIG. 1 is a block diagram of a semiconductor device according to example embodiments of the present general inventive concept.

Referring to FIG. 1, a semiconductor device may include a memory cell array 1 and peripheral circuits controlling the memory cell array 1.

The memory cell array 1 may include a plurality of memory blocks BLK0-BLKn, and each of the memory blocks BLK0-BLKn may include a plurality of memory cells storing data, a plurality of word lines and bit lines.

The peripheral circuits may include a row decoder 2, a data input/output circuit 3, and a column decoder 4. The row decoder 2 may be configured to be able to select one of the memory blocks BLK0-BLKn of the memory cell array 1 and/or to be able to select one word line of the selected memory block, based on a given address information. The data input/output circuit 3 may be configured to store data in the memory cells or read out data from the memory cells. The column decoder 4 may be configured to select at least one of the bit lines in the selected memory block and serve as a path for transmitting data between the data input/output circuit 3 and an external device (for example, a memory controller). In some exemplary embodiments, the peripheral circuits may further include a logic circuit and a voltage generator.

Figure 2:
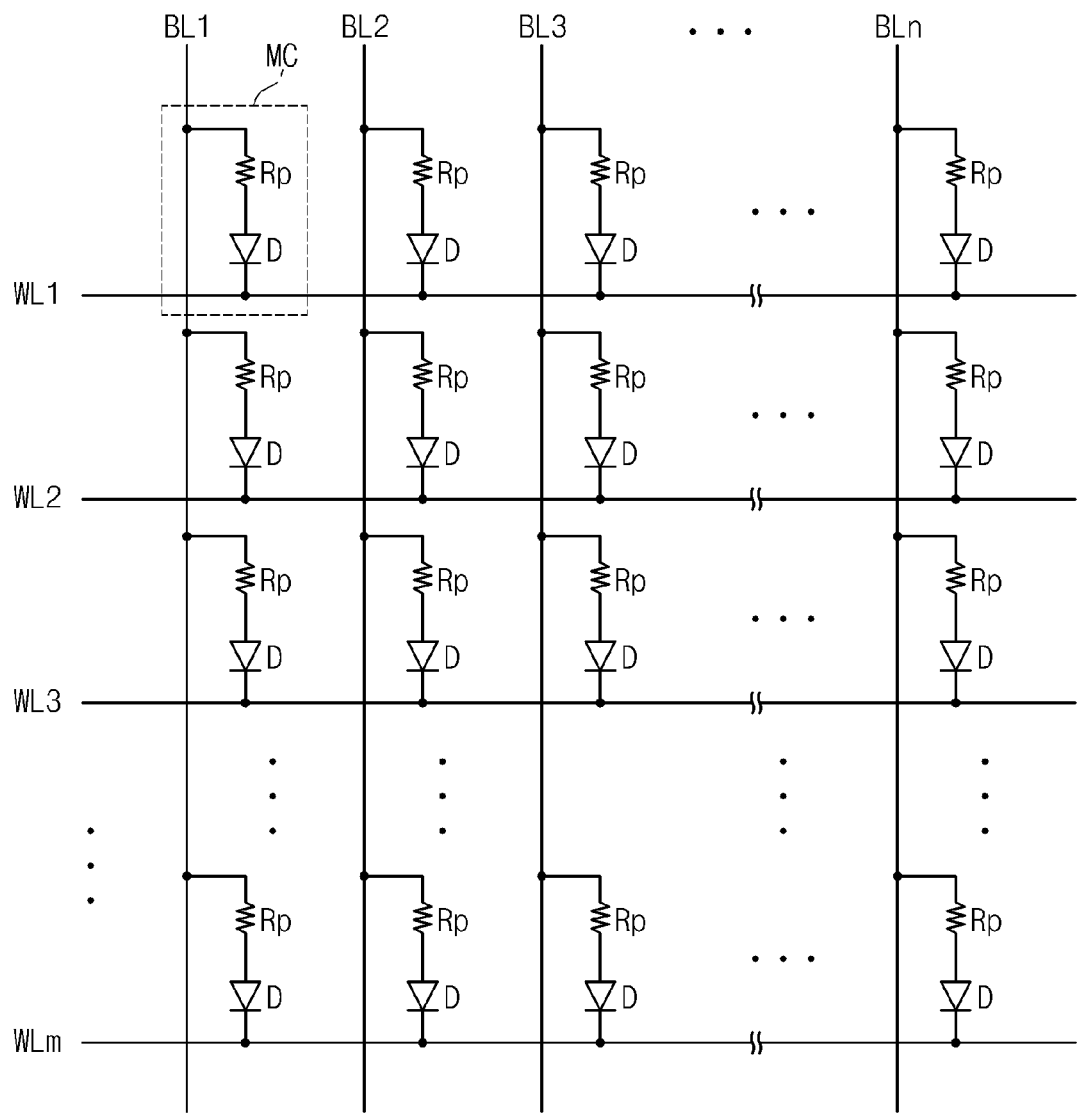
FIG. 2 is a schematic circuit diagram of a memory cell array of a semiconductor device according to example embodiments of the present general inventive concepts.

FIG. 2 is a schematic circuit diagram of a memory cell array of a semiconductor device according to example embodiments of the present general inventive concept.

Referring to FIG. 2, a memory cell array may include a plurality of word lines WL1-WLm, a plurality of bit lines BL1-BLn, and a plurality of memory cells MC. The memory cells MC may be disposed at intersections between the word lines WL1-WLm and the bit lines BL1-BLn, respectively.

In some exemplary embodiments, each of the memory cells MC may include a memory element Rp and a selection element D. The memory element Rp may be interposed between one of the bit lines BL1-BLn and the selection element D, and the selection element D may be interposed between the memory element Rp and one of the word lines WL1-WLm.

In some exemplary embodiments, the memory element Rp may be a variable resistance element whose resistance can be varied in two or more levels by an electric pulse applied thereto. For example, the memory element Rp may include a phase changeable material whose crystal structure can be controlled by an amount of electric current. The phase changeable material may be at least one of chalcogenides including at least one of antimony (Sb), tellurium (Te), or selenium (Se). For example, the memory element Rp may be at least one of GaSb, InSb, InSe, $Sb_2Te_3$, GeTe, GeSbTe, GaSeTe, InSbTe, $SnSb_2Te_4$, InSbGe, AgInSbTe, (GeSn)S-bTe, GeSb(SeTe), or $Te_{81}Ge_{15}Sb_2S_2$.

The phase changeable material may be a material whose crystalline structure or electric resistance can be reversibly transferred to a high resistive amorphous state and a low resistive crystallized state by controlling Joule's heat generated therein. For example, a state or phase of the phase changeable material can be reversibly changed by controlling temperature and cooling time thereof, and this phase changing mechanism can be used to write data to the memory element Rp.

In other exemplary embodiments, the memory element Rp may include at least one of perovskite compounds, transition metal oxides, magnetic materials, ferromagnetic materials, or antiferromagnetic materials.

The selection element D may control an electric current between the memory element Rp and one of the word lines WL1-WLm, depending on a voltage of the corresponding word line WL1-WLm.

In some exemplary embodiments, the selection element D may be configured to form a PN junction diode or a PIN junction diode. For instance, an anode of the diode may be connected to the memory element Rp and a cathode of the diode may be connected to one of the word lines WL1-WLm. In this case, if a voltage difference between the anode and cathode is higher than a threshold voltage of the diode, the diode will be in the "on" state and an electric current can be supplied to the memory element Rp.

In other exemplary embodiments, the selection element D may be a metal-oxide-semiconductor (MOS) transistor. For example, the selection element D may be a NMOS transistor whose gate electrode is connected to one of the word lines WL1-WLm. In other words, voltages applied to the word lines WL1-WLm can be used to control an electric current flowing through the memory element Rp.

In still other exemplary embodiments, the selection element D may be a PNP or NPN bipolar transistor (BJT).

Figure 9:
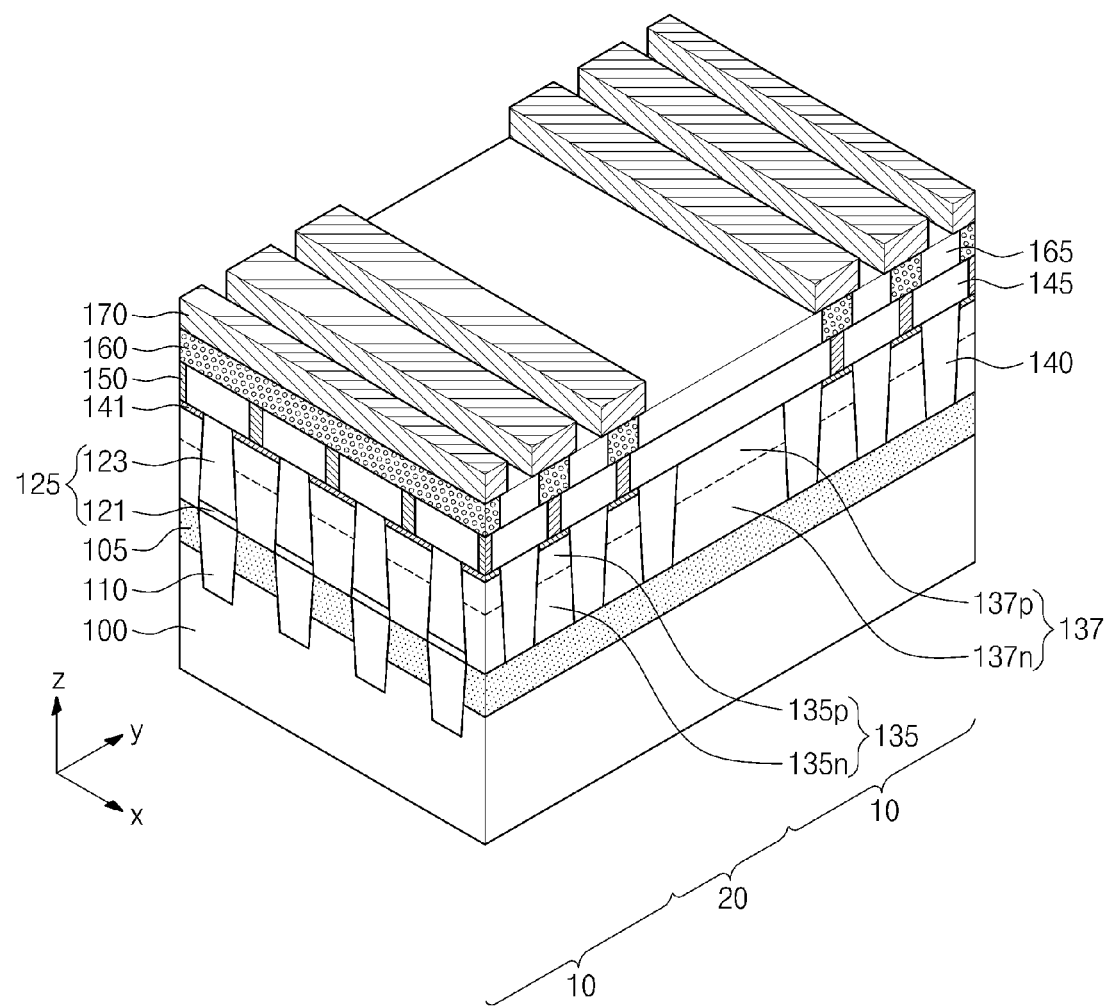
Figure 10:
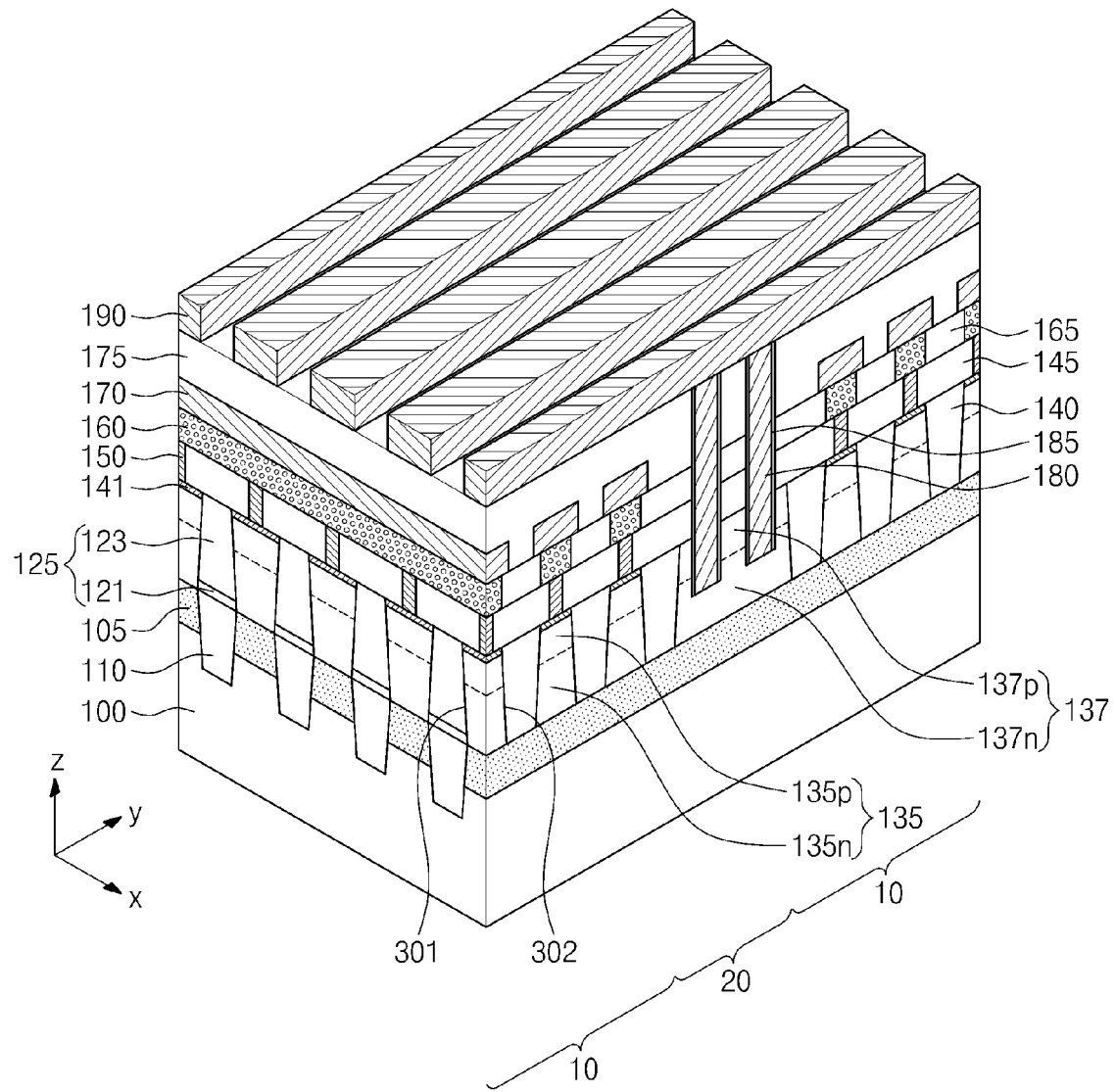
Figure 11:
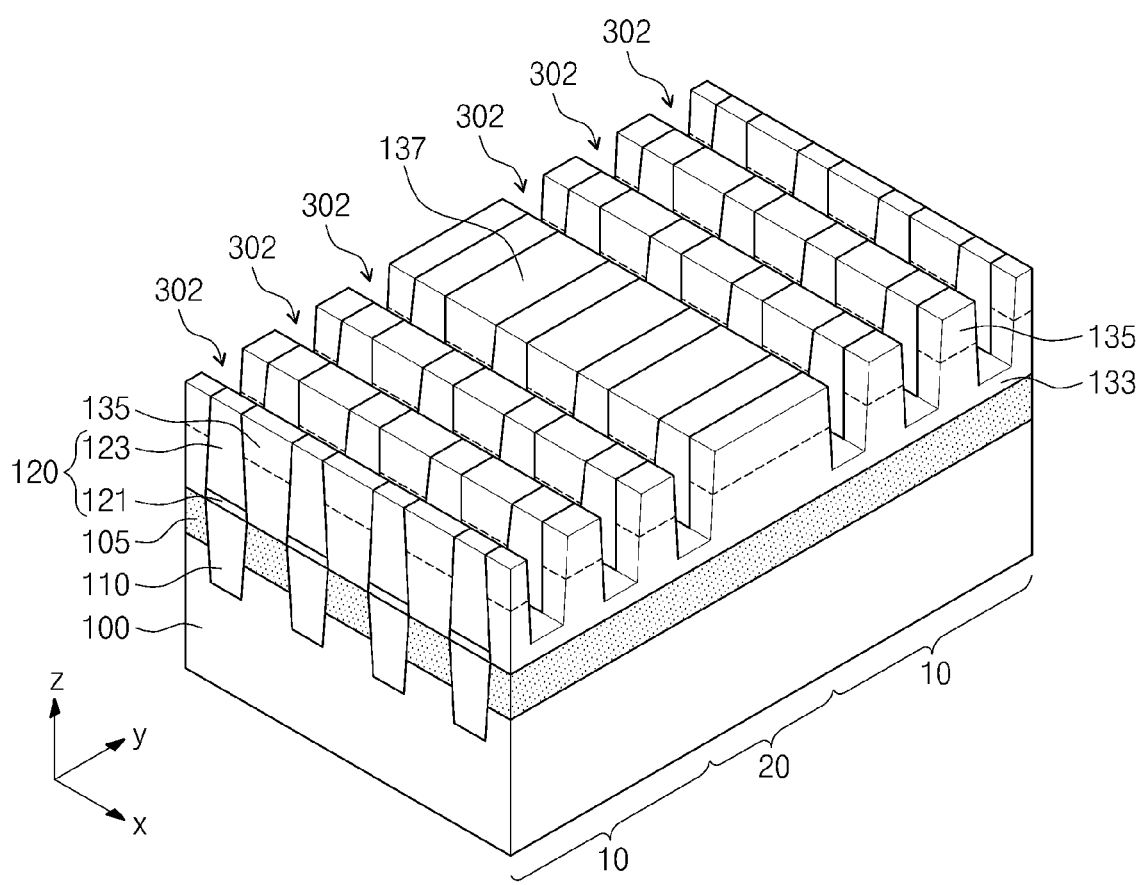
FIG. 11 is a perspective view illustrating a method of fabricating a semiconductor device according to modified embodiments of the present general inventive concepts.

FIGS. 3 through 10 are perspective views illustrating a method of fabricating a semiconductor device according to example embodiments of the present general inventive concepts, and FIG. 11 is a perspective view illustrating a method of fabricating a semiconductor device according to modified exemplary embodiments of the inventive concept.

Figure 3:
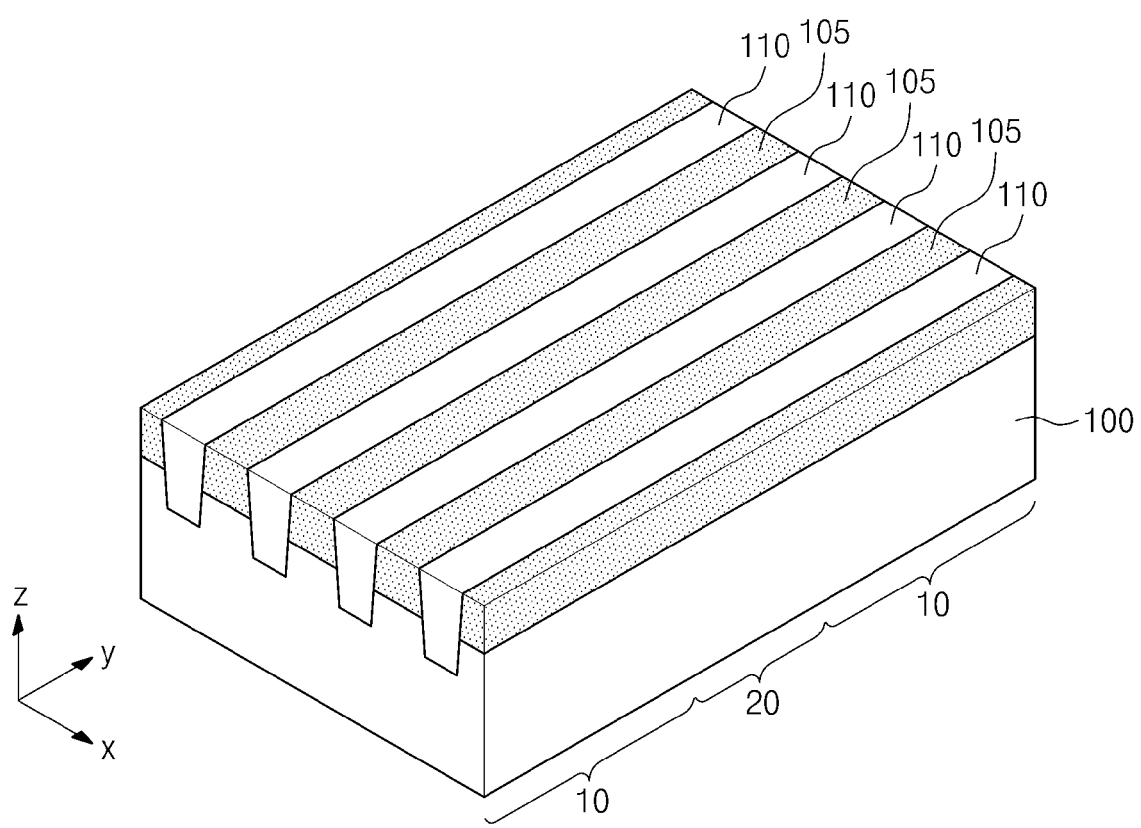
FIGS. 3 through 10 are perspective views illustrating a method of fabricating a semiconductor device according to example embodiments of the present general inventive concepts.

Referring to FIG. 3, a semiconductor substrate 100 may be prepared to include a plurality of cell array regions 10 and a contact region 20 interposed between the cell array regions 10.

The semiconductor substrate 100 may extend along a lengthwise direction that defines a length of the semiconductor device and a widthwise direction that defines a width of the semiconductor device. Further, the semiconductor substrate 100 may be formed of a single-crystalline semiconductor material. For example, the semiconductor substrate 100 may be one of a silicon substrate, a silicon-on-insulator (SOI) substrate, a germanium substrate, a germanium-on-insulator (GOI) substrate, a silicon-germanium substrate, or an epitaxially grown substrate.

Device isolation patterns 110 may be formed to define active regions in the semiconductor substrate 100. In some exemplary embodiments, the device isolation patterns 110 and the active regions may have a linear shape extending along a direction of y-axis.

The formation of the device isolation patterns 110 may include patterning the semiconductor substrate 100 to form device isolation trenches delimiting the active regions, and filling the device isolation trenches with an insulating material. The formation of the device isolation trenches may include forming a device isolation mask (not shown) delimiting the active regions on the semiconductor substrate 100 and then anisotropically etching the semiconductor substrate 100 using the device isolation mask as an etch mask.

The device isolation patterns 110 may be formed of at least one of silicon oxide or low-k dielectrics (for example, having a lower dielectric constant than silicon oxide). In addition, the formation of the device isolation patterns 110 may further include a liner structure (not shown) covering inner walls of the device isolation trenches. The liner structure may include a thermal oxide layer, which may be formed by thermally oxidizing the inner walls of the device isolation trenches, and a nitride liner conformally covering the structure provided with thermal oxide layer.

In some exemplary embodiments, before or after the formation of the device isolation patterns 110, lower interconnection lines 105 serving as the word lines WL1-WLm of FIG. 2 may be formed in the active regions of the semiconductor substrate 100. The lower interconnection lines 105 may have a linear shape extending along the direction of the y-axis. The lower interconnection lines 105 may be formed between the device isolation patterns 110.

The lower interconnection lines 105 may be doped regions formed by doping the semiconductor substrate 100 with impurities. In some exemplary embodiments, the lower interconnection lines 105 may be formed to have a conductivity type different from a conductivity type of the semiconductor substrate 100. For example, when the semiconductor substrate 100 is a p-type, the lower interconnection lines 105 may be formed by injecting n-type impurities of high concentration into the semiconductor substrate 100. Alternatively, the lower interconnection lines 105 may be formed of a metallic material.

Figure 4:
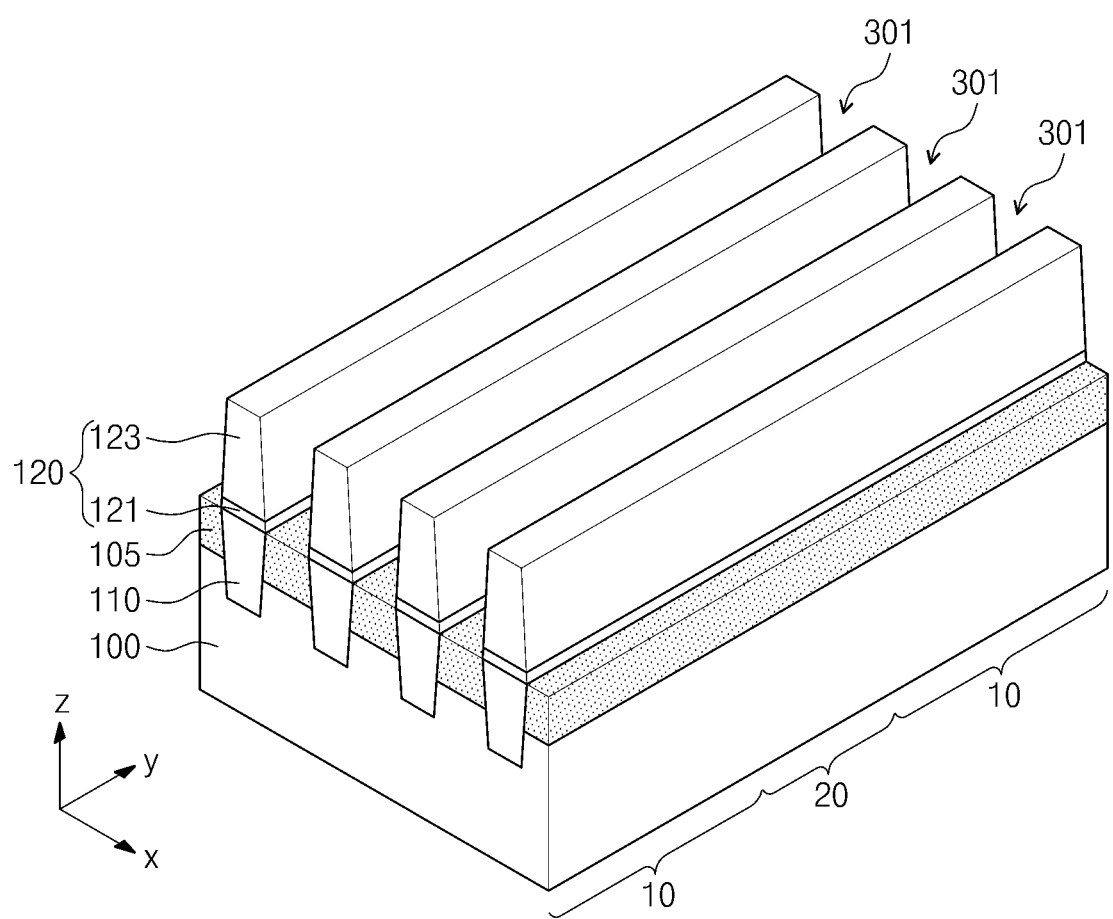

Referring to FIG. 4, mold patterns 120 may be formed on the semiconductor substrate 100 to define first trenches 301.

The formation of the mold patterns 120 may include sequentially stacking an etch stop layer 121 and a first insulating layer 123 on the semiconductor substrate 100, forming a first mask pattern (not shown) having a line-and-space shape on the first insulating layer 123, and then, anisotropically etching the first insulating layer 123 and the etch stop layer 121 using the first mask pattern as an etch mask to expose a top surface of the semiconductor substrate 100.

The etch stop layer 121 may be formed of oxide, nitride and/or oxynitride. The first insulating layer 123 may be formed of at least one selected from the group consisting of borosilicate glass (BSG), phosphosilicate glass (PSG), borophosphosilicate glass (BPSG), plasma-enhanced tetraethyl orthosilicate (PE-TEOS), high density plasma (HDP) materials. Alternatively, the first insulating layer 123 may be formed of at least one of low-k dielectrics having a lower dielectric constant than silicon oxide. The etch stop layer 121 may be formed to have a thickness ranging from several tens to several hundreds of angstroms, and the first insulating layer 123 may be formed to have a thickness ranging from several hundred to several thousand of angstroms.

The mold patterns 120 may be formed on the device isolation patterns 110 to have a linear shape extending along the direction of the y-axis. The first trenches 301 may be formed to expose the top surface of the semiconductor substrate 100. In some exemplary embodiments, the first trenches 301 may expose surfaces of the lower interconnection lines 105. As a result of the anisotropic etching process, the first trenches 301 may have a bottom width smaller than a top width. In addition, the maximum width of the first trenches 301 may be smaller than a minimum feature size. Hereinafter, the minimum feature size refers to a minimum pattern width that can be printed by a photolithography system.

The first trenches 301 may be performed to completely remove the etch stop layer 121 from the top surface of the semiconductor substrate 100, for example, in an over-etching manner. In this case, a surface of the semiconductor substrate 100 exposed by the first trenches 301 may be damaged. The surface damage of the semiconductor substrate 100 may lead to crystal defects of semiconductor layers 130 (of FIG. 5), which will be formed by a selective epitaxial growth process. However, according to example embodiments of the present general inventive concept, a cleaning process may be performed after the formation of the first trenches 301 to cure the surface of the semiconductor substrate 100 exposed by the first trenches 301. The cleaning process may be performed using a basic cleaning solution containing ammonia water, hydrogen peroxide water, and water.

Figure 5:
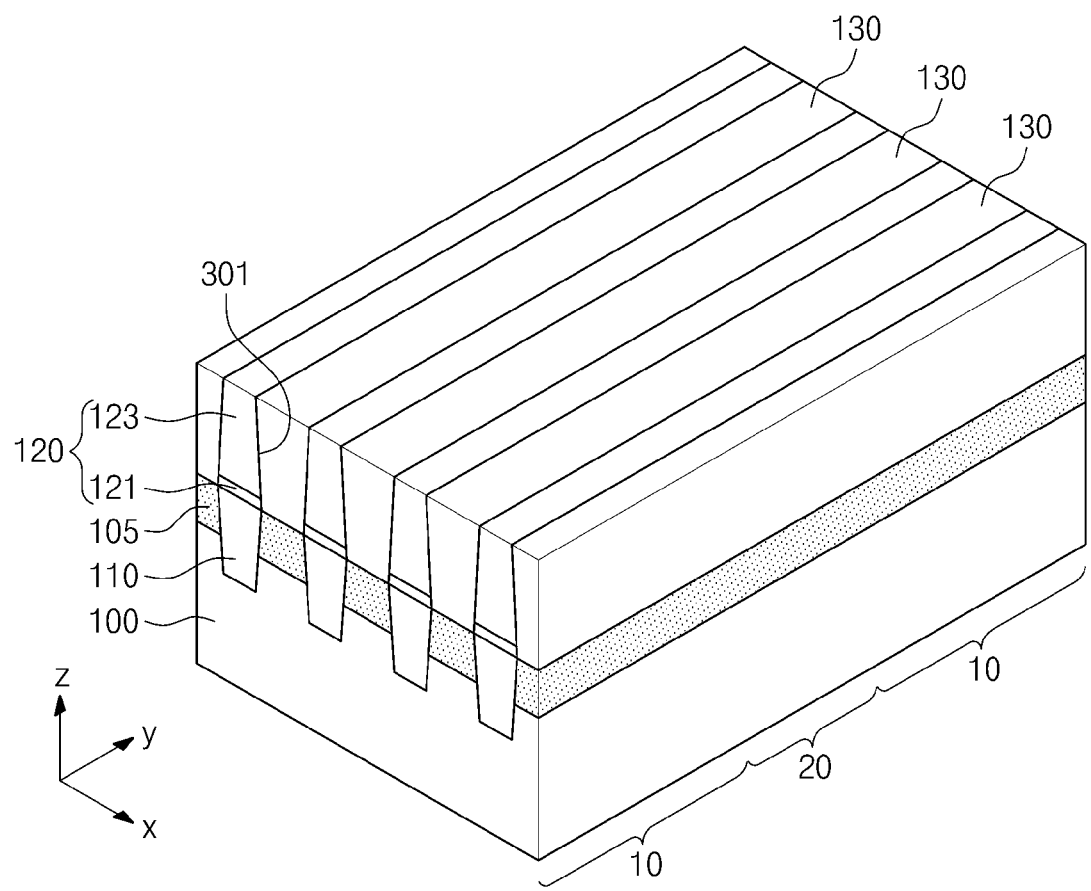

Referring to FIG. 5, semiconductor layers 130 may be formed to fill the first trenches 301. As a result, the semiconductor layers 130 may have a linear shape.

In some exemplary embodiments, the semiconductor layers 130 may be formed by a selective epitaxial growth (SEG) process, in which the semiconductor substrate 100 exposed by the mold patterns 120 are used as a seed layer. As a result, the semiconductor layers 130 may have a single-crystalline structure substantially, like the semiconductor substrate 100.

In other exemplary embodiments, the semiconductor layers 130 may be formed using a solid phase epitaxial process. For example, the formation of the semiconductor layers 130 may include depositing an amorphous or polycrystalline semiconductor layer to fill the first trenches 301, and then, crystallizing the amorphous or polycrystalline semiconductor layer.

In still other exemplary embodiments, the semiconductor layers 130 may be formed using a laser-induced epitaxial growth process. For example, the formation of the semiconductor layers 130 may include crystallizing an amorphous semiconductor layer provided in the first trenches 301 using a laser beam such as an excimer laser.

The semiconductor layers 130 may be grown over top surfaces of the mold patterns 120. In this case, the semiconductor layers 130 may be planarized to have flat top surfaces, after the growth of the semiconductor layers 130.

The semiconductor layers 130 may be in direct contact with the semiconductor substrate 100 or the lower interconnection lines 105, in the first trenches 301. Each of the semiconductor layers 130 may have a linear shape extending parallel to the mold patterns 120. Each of the semiconductor layers 130 may have sidewalls in contact with inner walls of the first trenches 301 and have a lower portion narrower than an upper portion. In addition, the maximum width of the semiconductor layer 130 may be smaller than the minimum feature size.

The semiconductor layers 130 may be formed of a material containing silicon (Si) and/or germanium (Ge). The semiconductor layers 130 may be formed to have one of single-crystalline, amorphous, and polycrystalline structures. In some exemplary embodiments, there may be interfacial surfaces having a discontinuous crystal structure between the semiconductor substrate 100 and the semiconductor layers 130.

Figure 6:
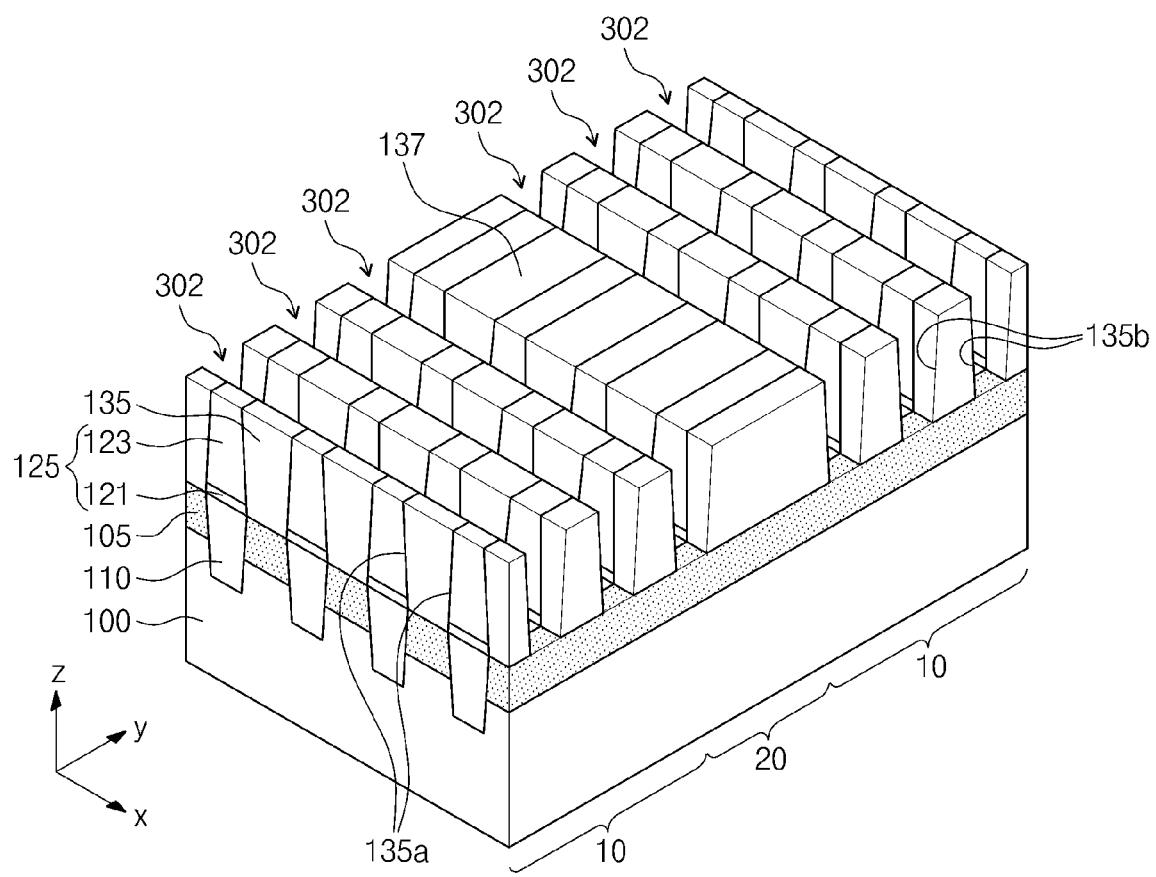

Referring to FIG. 6, a partial view of the semiconductor substrate 100 is illustrated. Second trenches 302 may be formed to cross the mold patterns 120 and the semiconductor layers 130. For example, the second trenches 302 may extend along the direction of the x-axis.

The formation of the second trenches 302 may include forming a second mask pattern (not shown) having a line-and-space shape to cross the mold patterns 120 and the semiconductor layers 130, and then, anisotropically etching the mold patterns 120 and the semiconductor layers 130 using the second mask pattern as an etch mask.

In some exemplary embodiments, the second trenches 302 may be formed to expose the top surface of the semiconductor substrate 100. For example, the second trenches 302 may be formed to expose portions of the lower interconnection lines 105 and/or portions of the etch stop layer 121.

As a result of the anisotropic etching process, the second trenches 302 may have a bottom width smaller than a top width. In addition, portions of the semiconductor substrate 100 exposed by the second trench 302 may be recessed to have a vertical level lower than other portions of the semiconductor substrate 100 covered with the semiconductor pattern 135.

As a result of the formation of the second trenches 302, the semiconductor layers 130 may be cut to form semiconductor patterns 135 two-dimensionally arranged on the semiconductor substrate 100.

Similarly, the first insulating layers 123 may be cut to form first insulating patterns 125 two-dimensionally arranged on the semiconductor substrate 100. Each of the first insulating patterns 125 may be interposed between the corresponding one of pairs of the semiconductor patterns 135 adjacent to each other in the direction of the x-axis. The first insulating patterns 125 have an inverse shape with respect to the shape of the semiconductor patterns 135. More specifically, the semiconductor patterns 135 include an upper portion and a lower portion that is smaller than the upper portion. The insulating patterns 125 have an upper portion and a lower portion that is greater than the upper portion. Accordingly, the insulating patterns 125 are inversely shaped with respect to the semiconductor patterns 135.

Figure 12:
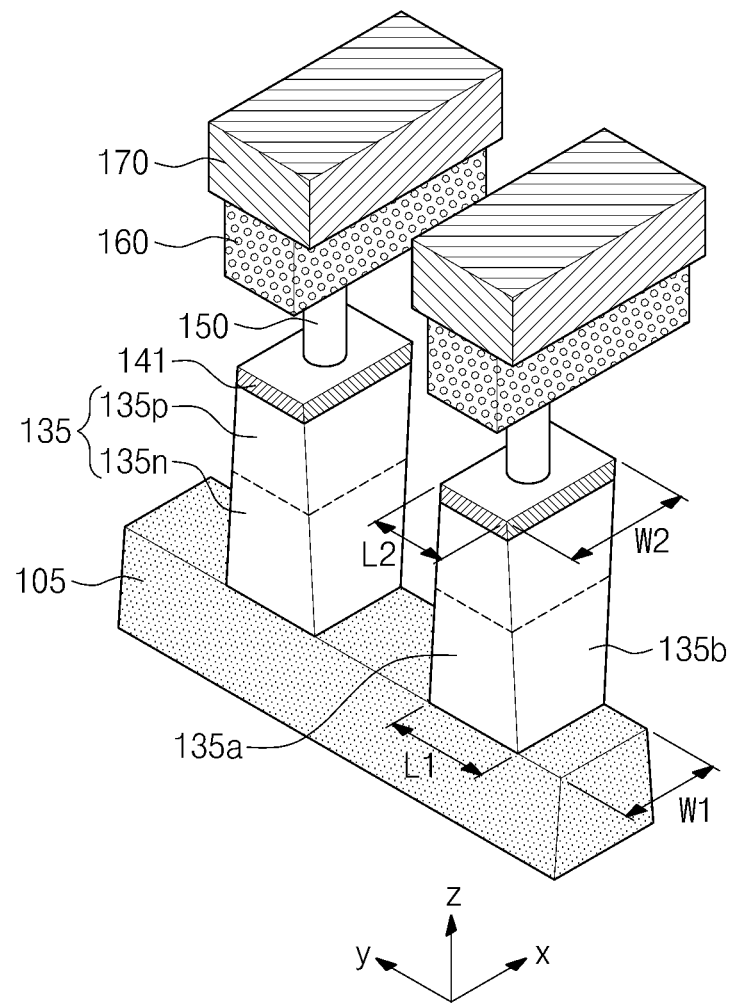
FIG. 12 is an enlarged perspective view of a semiconductor device according to example embodiments of the present general inventive concepts.

The semiconductor patterns 135 may have first sidewall surfaces 135a delimited by the first trenches 301 and second sidewall surfaces 135b delimited by the second trenches 302. For each of the semiconductor patterns 135, if a first lower width W1 and a first upper width W2 are measured in a vertical section parallel to the direction of the x-axis as shown in FIG. 12, the first lower width W1 may be smaller than the first upper width W2. Furthermore, for each of the semiconductor patterns 135, if a second lower width L1 and a second upper width L2 are measured in a vertical section parallel to the direction of the y-axis, the second upper width L2 may be smaller than the second lower width L1. In the direction of the y-axis, the maximum width of the semiconductor pattern 135 may be smaller than the minimum feature size.

The semiconductor pattern 135 may have substantially a irregular quadrilateral polyhedron shape, because it is cut by the first and second trenches 301 and 302 crossing each other.

According to a modified exemplary embodiment depicted in FIG. 11, the formation of the second trenches 302 may include anisotropically and partially etching the mold patterns 120 and the semiconductor layers 130. For example, the second trenches 302 may be formed to remain portions of the mold patterns 120 and portions of the semiconductor layers 130 thereunder. As a result, upper portions of the semiconductor patterns 135 may be two-dimensionally arranged on the semiconductor substrate 100 and lower portions of the semiconductor patterns 135 may be connected with each other via connecting portions 133. Here, the connecting portions 133 may be or include portions of the semiconductor patterns 135 remaining under the second trenches 302.

Referring to FIGS. 6 and 11, second trenches 302 may be formed to define pad semiconductor patterns 137, which may be provided on the contact region 20. For example, the pad semiconductor patterns 137 may be delimited by a pair of the second trenches 302 that are provided between the cell array regions 10 and the contact region 20. In the direction of the y-axis, a width of the pad semiconductor pattern 137 may be greater than that of the semiconductor pattern 135. In the direction of the x-axis, a wide of the pad semiconductor pattern 137 may be substantially equivalent to that of the semiconductor pattern 135. An x-axis directional width of the pad semiconductor pattern 137 may be smaller in an upper portion than in a lower portion, and a y-axis directional width of the pad semiconductor pattern 137 may be smaller in the lower portion than in the upper portion.

Figure 13:
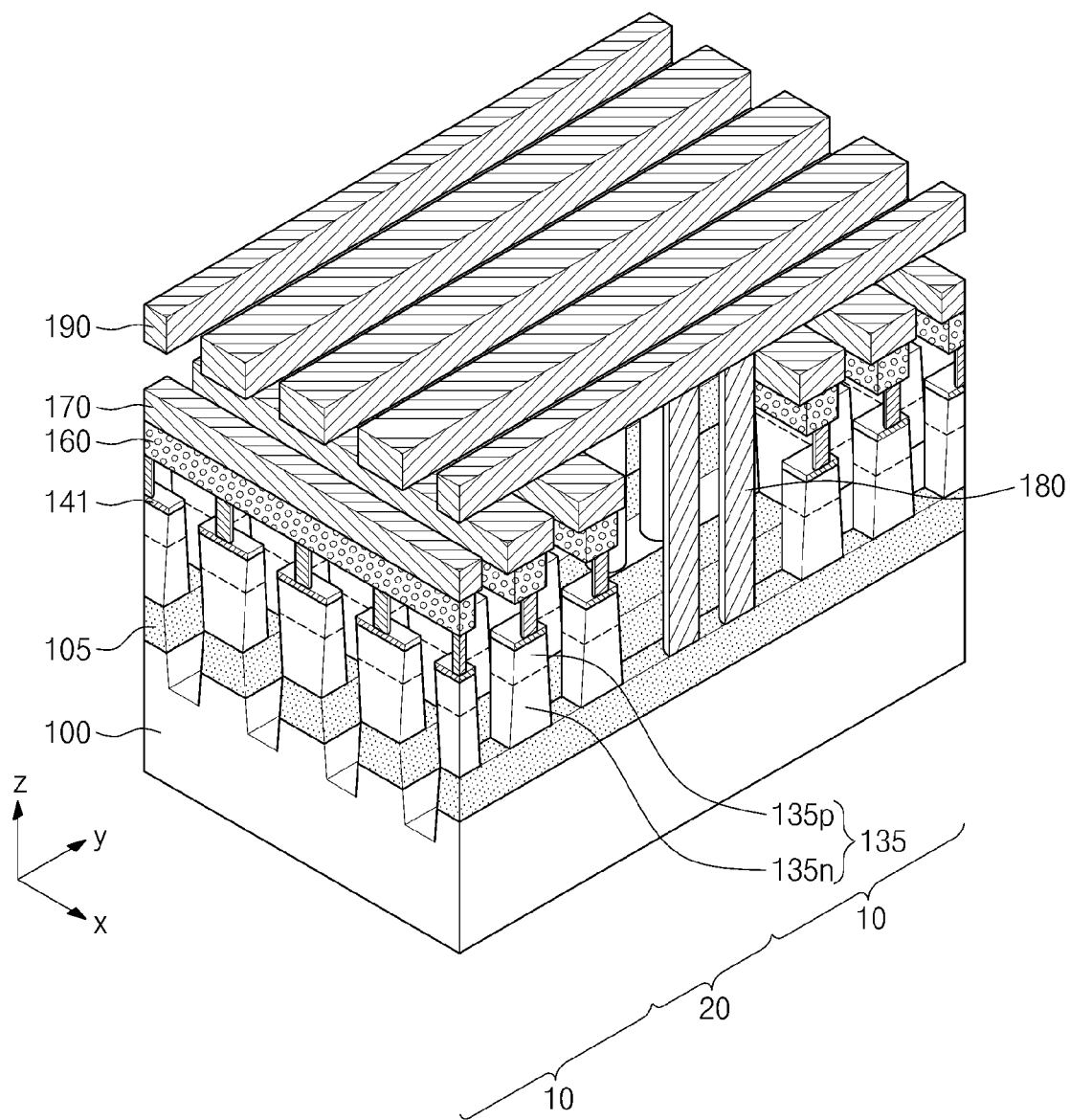
FIG. 13 is a perspective view of a semiconductor device according to modified embodiments of the present general inventive concepts.

According to an example depicted in FIG. 13, the semiconductor layers 130 may be removed from the contact region 20, during forming the second trenches 302. As a result, the semiconductor patterns 135 may be two-dimensionally arranged on the cell array regions 10, and top surfaces of the lower interconnection lines 105 and the device isolation patterns 110 may be exposed in the contact region 20.

Figure 7:
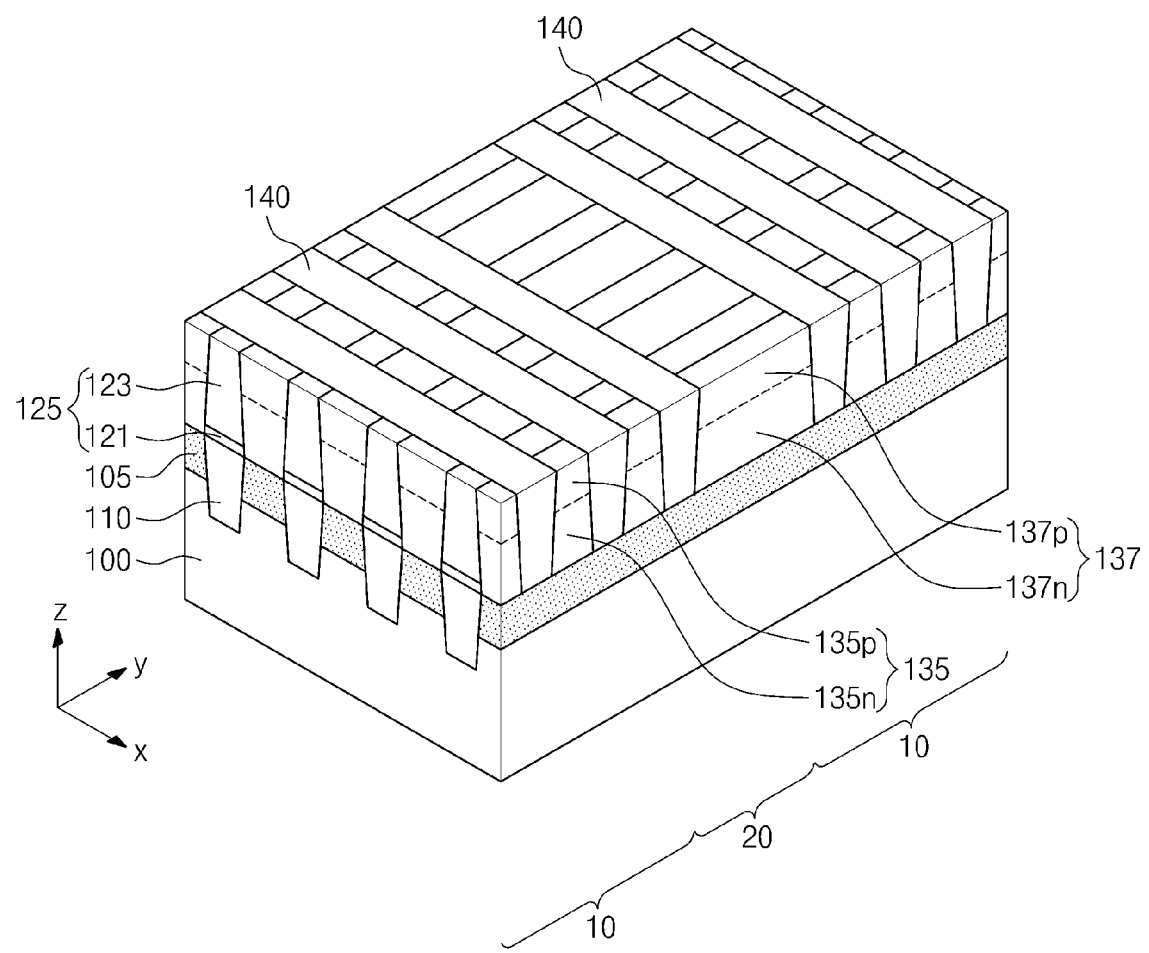

Referring to FIG. 7, second insulating patterns 140 may be formed to fill the second trenches 302. Each of the second insulating patterns 140 may extend along the direction of the x-axis and cover the second sidewalls 135b of the semiconductor patterns 135.

The formation of the second insulating patterns 140 may include filling the second trenches 302 with an insulating material and planarizing the insulating material to expose top surfaces of the first insulating patterns 125 and the semiconductor patterns 135.

The second insulating patterns 140 may be formed of at least one silicon oxide material, such as borosilicate glass (BSG), phosphosilicate glass (PSG), boro-phosphosilicate glass (BPSG), plasma-enhanced tetraethyl orthosilicate (PE-TEOS), or high density plasma (HDP) oxides. Alternatively, the second insulating patterns 140 may be formed of at least one of low-k dielectrics having a lower dielectric constant than silicon oxide.

Next, an upper doped region 135p and a lower doped region 135n may be formed in each of the semiconductor patterns 135.

The lower and upper doped regions 135n and 135p may have different conductivity types from each other. For example, the upper doped regions 135p may be formed by injecting p-type impurities into upper portions of the semiconductor patterns 135, and the lower doped regions 135n may be formed by injecting n-type impurities into lower portions of the semiconductor patterns 135. The p-type impurities include, but are not limited to, boron, and the n-type impurities include, but are not limited to, phosphorus. In addition, the lower and upper doped regions 135n and 135p may be formed to be in contact with each other, and in some exemplary embodiments, a p-type impurity concentration of the upper doped region 135p may be higher than an n-type impurity concentration of the lower doped region 135n.

The lower and upper doped regions 135n and 135p, formed in each of the semiconductor patterns 135, may form a PN junction diode capable of serving as a rectifying element. The semiconductor patterns 135 may also form a PIN junction diode, which includes a doped intrinsic semiconductor region between a p-type semiconductor and an n-type semiconductor region.

During the formation of the upper and lower doped regions 135p and 135n, upper and lower pad doped pad regions 137p and 137n may be formed in each of the pad semiconductor patterns 137. In at least one exemplary embodiment, the upper doped pad region 137p may be positively doped to form a p-type semiconductor pad region, and the lower doped pad region 137n may be negatively doped to form a n-type semiconductor pad region. It can be appreciated, however, that the pad semiconductor patterns 137 are not limited to the doping arrangements of the pad regions 137p, 137n described above.

Figure 8:
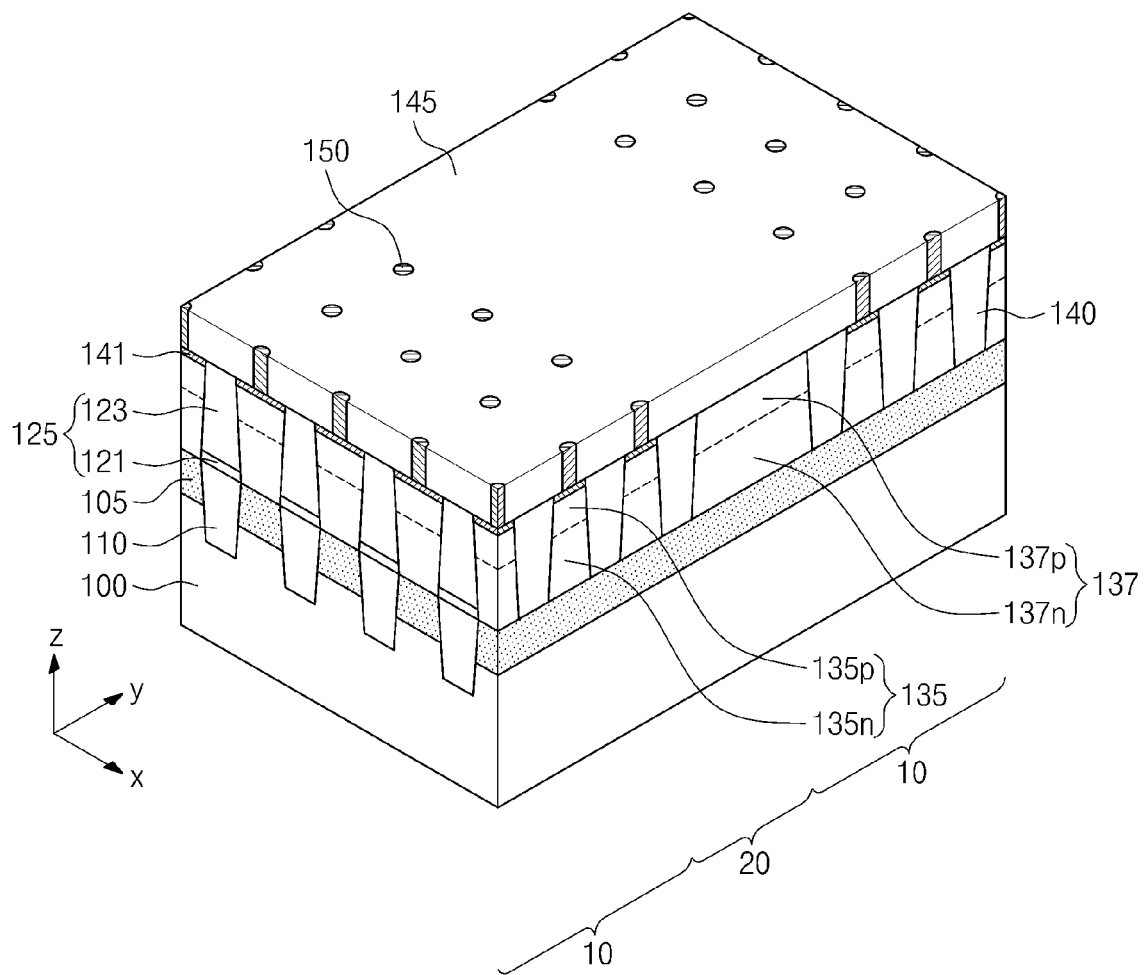

Referring to FIG. 8, lower electrodes 150 may be formed on the semiconductor patterns 135, respectively.

The formation of the lower electrodes 150 may include forming a first interlayer dielectric 145 on the semiconductor patterns 135, patterning the first interlayer dielectric 145 to form openings, each of which exposes a top surface of the corresponding one of the semiconductor patterns 135, and then, forming lower electrodes 150 in the openings.

The first interlayer dielectric 145 may be formed of at least one of boro-phosphosilicate glass (BPSG), high density plasma (HDP) oxides, tetraethyl orthosilicate (TEOS), undoped silicate glass (USG), or silazene-based materials (such as, Tonen Silazene (TOSZ)). The first interlayer dielectric 145 may be formed using a deposition technique providing a good step coverage property, such as a chemical vapor deposition (CVD) or an atomic layer deposition (ALD). After the formation of the first interlayer dielectric 145, a planarization process, such as a chemical-mechanical polishing (CMP) or etch-back process, may be performed to make a top surface of the first interlayer dielectric 145 as flat as possible.

In some exemplary embodiments, the lower electrodes 150 may be formed in the openings, each of which is formed through the first interlayer dielectric 145. In an inner wall of the opening, a spacer (not shown) may be formed to reduce a top area of the lower electrode 150.

The lower electrodes 150 may be formed of at least one selected from the group consisting of nitrides including metallic elements, oxynitrides including metallic elements, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW), and tungsten silicide (WSix). Here, the nitrides including metallic elements may include TiN, TaN, WN, MoN, NbN, TiSiN, TiAlN, TiBN, ZrSiN, WSiN, WBN, ZrAlN, MoSiN, MoAlN, TaSiN, and TaAlN, and the oxynitrides including metallic elements may include TiON, TiAlON, WON, and TaON.

Alternatively, an ohmic layer 141 may be formed on the top surfaces of the semiconductor patterns 135 before forming the lower electrodes 150 (for example, before forming the first interlayer dielectric 145.

The ohmic layer 141 may be formed by reacting the top surfaces of the semiconductor patterns 135 with a metallic material. In this case, the ohmic layer 141 may be formed of a metal silicide layer (e.g., of cobalt silicide, titanium silicide, nickel silicide or tungsten silicide).

Referring to FIG. 9, memory elements 160 and upper interconnection lines 170 may be formed on the lower electrodes 150.

For instance, a second interlayer dielectric 165 may be formed on the first interlayer dielectric 145 provided with the lower electrodes 150. The second interlayer dielectric 165 may be formed to have openings exposing the top surfaces of the lower electrodes 150 and crossing the lower interconnection lines 105 or the first trenches 301. Memory elements 160 may be formed in the openings of the second interlayer dielectric 165, respectively. For instance, each of the memory elements 160 may be formed to have a linear shape crossing the lower interconnection lines 105. Alternatively, each of the memory elements may be formed parallel to the lower interconnection lines 105. In other exemplary embodiments, the memory elements 160 may be two-dimensionally arranged on the semiconductor substrate 100. For instance, each of the memory elements 160 may be disposed on the corresponding one of the semiconductor patterns 135.

In some exemplary embodiments, the memory elements 160 may include at least one of variable resistance materials, whose resistance can be selectively changed using an electric current flowing therethrough. For example, the memory elements 160 may include at least one of phase changeable materials, whose crystallographic structure can be reversibly switched between a high-resistance amorphous state and a low-resistance crystalline state, using the Joule-heating effect. The phase changeable materials may be chalcogenide materials that contain at least one of antimony (Sb), tellurium (Te), or selenium (Se).

For example, the phase changeable materials may be at least one of chalcogenides (such as Ge—Sb—Te, As—Sb—Te, As—Ge—Sb—Te, Sn—Sb—Te, Ag—In—Sb—Te, In—Sb—Te, 5A group element-Sb—Te, 6A group element-Sb—Te, 5A group element-Sb—Se, 6A group element-Sb—Se, Ge—Sb, In—Sb, Ga—Sb, or Ge—Sb—Te doped with C, N, B, Bi, Si, P, Al, Dy or Ti). The phase changeable materials may be formed using PVD or CVD. In the case in which the memory elements 160 include a phase changeable material, a capping electrode layer (not shown) may be formed on the phase changeable material, before patterning the phase changeable material to form the memory elements 160.

In other exemplary embodiments, the memory elements 160 may include a layered structure whose electric resistance can be changed using a spin-polarized current or a spin torque transfer mechanism. For example, the memory elements 160 may be configured to have a magneto-resistance property and include at least one ferromagnetic material and/or at least one antiferromagnetic material. In still other exemplary embodiments, the memory elements 160 may include at least one of perovskite compounds or transition metal oxides.

The upper interconnection lines 170 may be formed on the memory elements 160 to cross the lower interconnection lines 105 (for example, parallel to the direction of the x-axis). In some exemplary embodiments, the upper interconnection lines 170 may be formed to be substantially parallel to the memory elements 160.

The upper interconnection lines 170 may be formed of at least one selected from the group consisting of nitrides including metallic elements, oxynitrides including metallic elements, carbon (C), titanium (Ti), tantalum (Ta), aluminum titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten titanium (TiW), and tungsten silicide (WSix). Here, the nitrides including metallic elements may include TiN, TaN, WN, MoN, NbN, TiSiN, TiAlN, TiBN, ZrSiN, WSiN, WBN, ZrAlN, MoSiN, MoAlN, TaSiN, and TaAlN, and the oxynitrides including metallic elements may include TiON, TiAlON, WON, and TaON.

Referring to FIG. 10, strapping interconnection lines 190 may be formed on the upper interconnection lines 170.

The strapping interconnection lines 190 may be formed by stacking a metal conductive layer on the third interlayer dielectric 175 and then patterning the metal conductive layer. The strapping interconnection lines 190 may extend along the direction of the y-axis and be substantially parallel to the lower interconnection lines 105. The strapping interconnection lines 190 may be electrically connected to the lower interconnection lines 105 via the contact plugs 180.

In some exemplary embodiments, the formation of the contact plugs 180 may include forming contact holes to penetrate the first to third interlayer dielectrics 145, 165 and 175, and then depositing a metallic layer in the contact holes. The contact holes may be inserted into the pad semiconductor pattern 137. For example, the contact holes may be formed using an anisotropic etching process to expose the lower pad doped regions 137n through the upper pad doped region 137p. As a result, the contact plugs 180 may be electrically connected to the lower pad doped regions 137n. In some exemplary embodiments, before the formation of the contact plugs 180, an insulating layer 185 may be formed to surround an outer sidewall of the contact plug 180. Due to the presence of the insulating layer 185, it is possible to prevent the contact plugs 180 from being electrically connected to the upper pad doped region 137p. Since the pad semiconductor patterns 137 are formed on the semiconductor substrate 100, an aspect ratio of the contact plug 180 can be reduced, for example, compared with the case depicted in FIG. 13.

The strapping interconnection lines 190 and the contact plugs 180 may be formed of metallic materials. For example, the strapping interconnection lines 190 and the contact plugs 180 may include at least one of conductive metal nitrides, metals, and conductive carbon compounds. In some exemplary embodiments, the strapping interconnection lines 190 and the contact plugs 180 may include at least one selected from the group consisting of TiN, TaN, WN, MoN, NbN, TiSiN, TiAlN, TiBN, ZrSiN, WSiN, WBN, ZrAlN, MoSiN, MoAlN, TaSiN, TaAlN, Ti, W, Mo, Ta, TiSi, TaSi, TiON, TiAlON, WON, TaON, and conductive carbon compounds.

As shown in FIG. 13, in the case in which the pad semiconductor pattern 137 is not provided in the contact region 20, the contact plugs 180 may be in direct contact with the top surface of the lower interconnection line 105.

FIG. 12 is an enlarged perspective view of a semiconductor device according to example exemplary embodiments of the present general inventive concepts, and FIG. 13 is an enlarged perspective view of a semiconductor device according to modified exemplary embodiments of the present general inventive concepts. Hereinafter, the semiconductor device fabricated by the afore-described method will be described with reference to FIGS. 10, 12 and 13.

Referring to FIGS. 10 and 12, the semiconductor device may include the semiconductor substrate 100, the lower interconnection lines 105 on the semiconductor substrate 100, the upper interconnection lines 170 crossing the lower interconnection lines 105, the selection elements disposed at intersections, respectively, of the lower and upper interconnection lines 105 and 170, and the memory elements 160 interposed between the selection elements and the upper interconnection lines 170. The selection elements may be two-dimensionally arranged on the semiconductor substrate 100 to control a flow of electric current passing through the memory elements 160.

The lower interconnection lines 105 may be shaped like a line extending along the direction of the y-axis. In some exemplary embodiments, the lower interconnection lines 105 may be doped regions formed by doping the semiconductor substrate 100 with impurities. The lower interconnection lines 105 may have a conductivity type different from a conductivity type of the semiconductor substrate 100.

The selection elements may include the semiconductor patterns 135 fabricated by the afore-described method. Each of the semiconductor patterns 135 may include the upper and lower doped regions 135p and 135n that may have conductivity types different from each other. For example, the upper doped region 135p may be positively doped to form a p-type semiconductor region, and the lower doped region 135n may be negatively doped to form a n-type semiconductor region. Further, the lower doped region 135n may have a conductivity type that is the same as the conductivity type of the lower interconnection lines 105, and the upper doped region 135p may have a conductivity type different from the conductivity type of the lower doped region 135n. As a result, each of the semiconductor patterns 135 may include a PN junction consisting of the upper and lower doped regions 135p and 135n. Alternatively, an intrinsic region may be interposed between the upper and lower doped regions 135p and 135n, thereby forming a PIN junction diode in the semiconductor pattern 135.

Along the direction of the z-axis, the lower doped region 135n and the lower interconnection line 105 may be interposed between the upper doped region 135p and the semiconductor substrate 100. In some aspects, it can be said that the semiconductor substrate 100, the upper and lower doped regions 135p and 135n, and the lower interconnection line 105 form a PNP or NPN bipolar transistor.

According to the afore-described fabricating method, the semiconductor patterns 135 may be cut by the first and the second trenches 301 and 302. In other words, the semiconductor patterns 135 may be spaced apart from each other in both of the directions of the x- and y-axes or be two-dimensionally arranged on the semiconductor substrate 100.

Referring to FIG. 12, each of the semiconductor patterns 135 may have the first sidewall surfaces 135a delimited by the first trenches 301 to face each other and the second sidewall surfaces 135b delimited by the second trenches 302 to face each other. Each of the semiconductor patterns 135 may have top or bottom surfaces with a substantially rectangular shape.

For each of the semiconductor patterns 135, if a first lower width W1 and a first upper width W2 are measured in a vertical section parallel to the direction of x-axis or are given by as distances between the first sidewall surfaces 135a, the first lower width W1 may be smaller than the first upper width W2.

Furthermore, for each of the semiconductor patterns 135, if a second lower width L1 and a second upper width L2 are measured in a vertical section parallel to the direction of y-axis or are given by distances between the second sidewall surfaces 135b, the second upper width L2 may be smaller than the second lower width L1.

In other exemplary embodiments, as shown in FIG. 11, the connecting portions 133 may be formed on the lower interconnection lines 105 to be substantially parallel to the lower interconnection lines 105 and connect the lower portions of the semiconductor patterns 135 with each other. A top surface of the connecting portion 133 may be closer to the semiconductor substrate 100 than an interfacial boundary between the upper and lower doped regions 135p and 135n or an interface whose net concentration of impurity is zero.

Referring again to FIG. 10, the first insulating patterns 125 may be interposed between the semiconductor patterns 135, respectively, which are adjacent to each other in the direction of x-axis. The second insulating patterns 140 may be interposed between the semiconductor patterns 135 adjacent to each other in the direction of y-axis, and moreover, the second insulating patterns 140 may extend between the first insulating patterns 125 adjacent to each other in the direction of y-axis. In other words, the semiconductor patterns 135 may be surrounded by the first and second insulating patterns 125 and 140. In some exemplary embodiments, the top surfaces of the semiconductor patterns 135 may be coplanar with those of the first and second insulating patterns 125 and 140.

The lower electrodes 150, the memory elements 160, and the upper interconnection lines 170 may be disposed on the semiconductor patterns 135.

In some exemplary embodiments, each of the memory elements 160 may be substantially parallel to the upper interconnection lines 170 and be connected to a plurality of the lower electrodes 150. Alternatively, the memory elements 160 may be two-dimensionally arranged. In other words, each of the memory elements 160 may be disposed on the corresponding one of the semiconductor patterns 135. As described above, the memory elements 160 may be formed of a variable resistance material whose resistance can be selectively changed using an electric current flowing therethrough. For example, the memory element 160 may include at least one of phase changeable materials whose crystallographic structure can be reversibly switched between a high-resistance amorphous state and a low-resistance crystalline state. Alternatively, the memory element 160 may include at least one of perovskite compounds, transition metal oxides, magnetic materials, ferromagnetic materials, antiferromagnetic materials and/or ferroelectric material.

Each of the lower electrodes 150 may be disposed between the corresponding one of the semiconductor patterns 135 and the corresponding one of the memory elements 160. A horizontal area of the lower electrode 150 may be smaller than that of the semiconductor pattern 135 or the memory element 160.

In some exemplary embodiments, the lower electrodes 150 may be shaped like a pillar. However, a shape of the lower electrode 150 may be variously modified in such a way that the lower electrode 150 can have a reduced area in a horizontal section. For example, a vertical section of the lower electrode 150 may be shaped like a letter "U", a letter "L", a hollow cylinder, a ring, or a cup.

The ohmic layer 141 may be interposed between the lower electrodes 150 and the semiconductor patterns 135 to reduce a contact resistance therebetween. For example, the ohmic layer 141 may be formed of a metal silicide layer (e.g., of titanium silicide, cobalt silicide, tantalum silicide, nickel silicide or tungsten silicide).

The upper interconnection lines 170 may be disposed on the memory elements 160 to cross the lower interconnection lines 105 and be electrically connected to the memory elements 160.

In some exemplary embodiments, the semiconductor substrate 100 may include the contact region 20 interposed between the cell array regions 10. The strapping interconnection lines 190 may be disposed to cross the upper interconnection lines 170 and the contact region 20. The strapping interconnection lines 190 may be electrically connected to the lower interconnection lines 105 via the contact plugs 180 provided in the contact region 20.

The strapping interconnection lines 190 may be substantially parallel to the lower interconnection lines 105. The strapping interconnection lines 190 and the contact plugs 180 may be formed of metallic materials, and this suppresses a signal delay, which may be caused by a relatively high electric resistance of the lower interconnection line, 105, from occurring. According to example embodiments of the present general inventive concepts, each of the cell array regions 10 includes a plurality of memory cells that are arranged along the direction of the y-axis and are connected to the corresponding one of the lower interconnection lines 105. The lower interconnection lines 105 are connected to the strapping interconnection lines 190 via the contact plugs 180 in the contact region 20 interposed between the cell array regions 10. In other words, the lower interconnection lines 105 may be electrically connected to the strapping interconnection lines 190 in the middle of the lower interconnection lines 105. This enables suppression of a signal delay in word lines.

In the example depicted in FIG. 10, the pad semiconductor patterns 137 may be formed on the contact region 20 of the semiconductor substrate 100. The contact plugs 180 may penetrate upper portions of the pad semiconductor patterns 137 to be connected to the lower doped region 137n.

In the example depicted in FIG. 13, the pad semiconductor pattern 137 may not be formed in the contact region 20. In this case, the contact plugs 180 may be directly connected to the lower interconnection lines 105 in the contact region 20.

FIGS. 14 through 18 are perspective views illustrating a method of fabricating a semiconductor device according to other example embodiments of the present general inventive concepts. For concise description, a previously described element may be identified by an identical reference number without repeating an overlapping description thereof.

Figure 14:
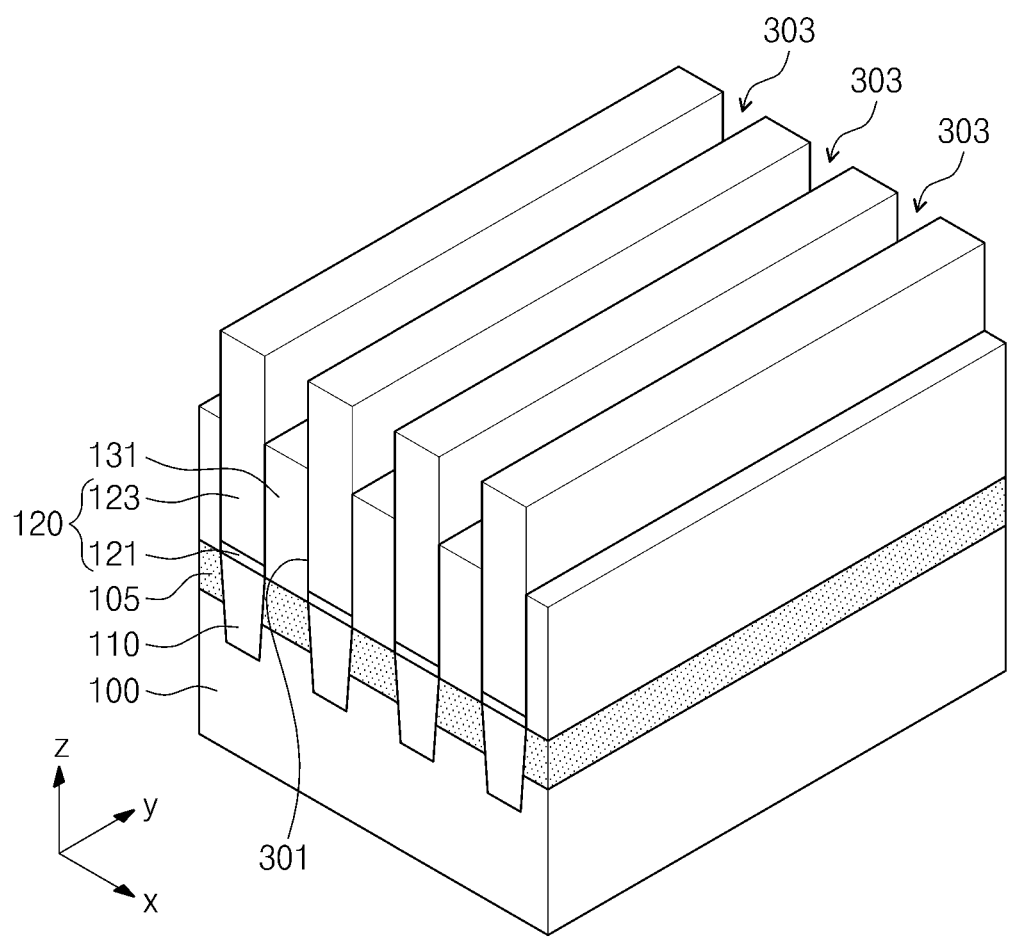
FIGS. 14 through 18 are perspective views illustrating a method of fabricating a semiconductor device according to other example embodiments of the present general inventive concepts.

Referring to FIG. 14, the mold patterns 120 and semiconductor layers 131 extending along the direction of the y-axis may be formed on the semiconductor substrate 100, as described with reference to FIGS. 3 through 5.

The mold patterns 120 may be formed by patterning the etch stop layer 121 and the first insulating layer 123 sequentially stacked on the semiconductor substrate 100. The semiconductor layers 131 may be an epitaxial layer grown using the semiconductor substrate 100 exposed by the mold patterns 120 as a seed layer.

According to at least one exemplary embodiment, top surfaces of the semiconductor layers 131 may be etched to form recess regions 303 exposing upper inner walls of the first trenches 301. The recess regions 303 may be shaped like a line or bar extending along the direction of the y-axis. The recess regions 303 may be formed by etching the semiconductor layers 131 using an etching method having an etch selectivity with respect to the mold patterns 120.

Figure 15:
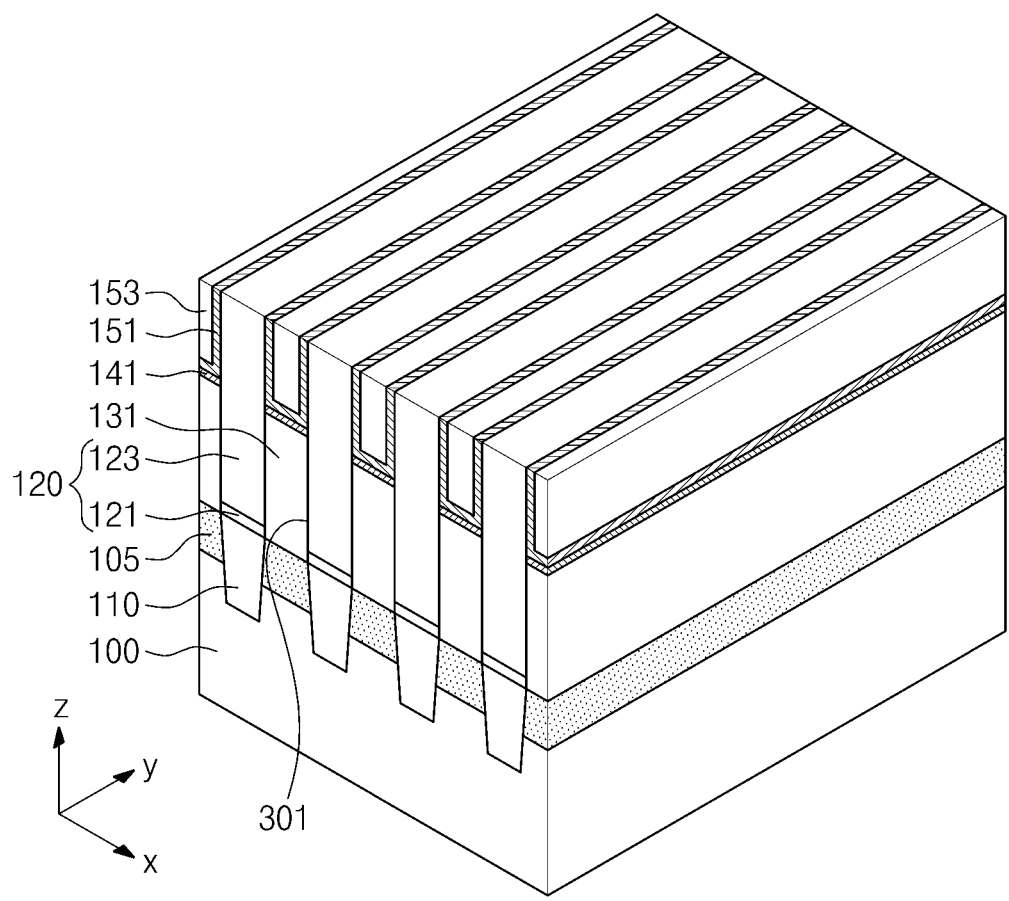

Referring to FIG. 15, a lower electrode layer 151 may be formed in the recess regions 303. The formation of the lower electrode layer 151 may include depositing a conductive layer to cover conformally inner walls of the recess regions 303, and then planarizing the conductive layer to expose the top surfaces of the mold patterns 120.

The lower electrode layer 151 may be formed using a deposition process, such as an atomic layer deposition (ALD), a metal organic chemical vapor deposition (MO-CVD), a thermal CVD, a biased CVD, a plasma CVD, and an ECR CVD. In addition, the lower electrode layer 151 may have a thickness ranging from about 0.1 nm to about 30 nm.

After the deposition of the conductive layer, a capping insulating layer 153 may be formed on the conductive layer to fill the recess region 303. The capping insulating layer 153 may be etched during the planarization of the conductive layer to expose the top surfaces of the mold patterns 120. The capping insulating layer 153 may be formed of at least one selected from the group consisting of, for example, $SiO_2$, SiN, PE-SiN, SiON, C, ALD-AlN, GeN, $Al_2O_3$, MgO, $SiO_2$, CaO, $Y_2O_3$, $TiO_2$, $Cr_2O_3$, FeO, CoO, ZrO and $CuO_2$.

Before the formation of the lower electrode layer 151, the ohmic layer 141 may be formed on the top surfaces of the semiconductor layers 131 exposed by the recess region 303.

The ohmic layer 141 may be formed by reacting the top surfaces of the semiconductor layers 131 with a metallic material. In this case, the ohmic layer 141 may be formed of a metal silicide layer (e.g., of cobalt silicide, titanium silicide, nickel silicide or tungsten silicide).

Figure 16:
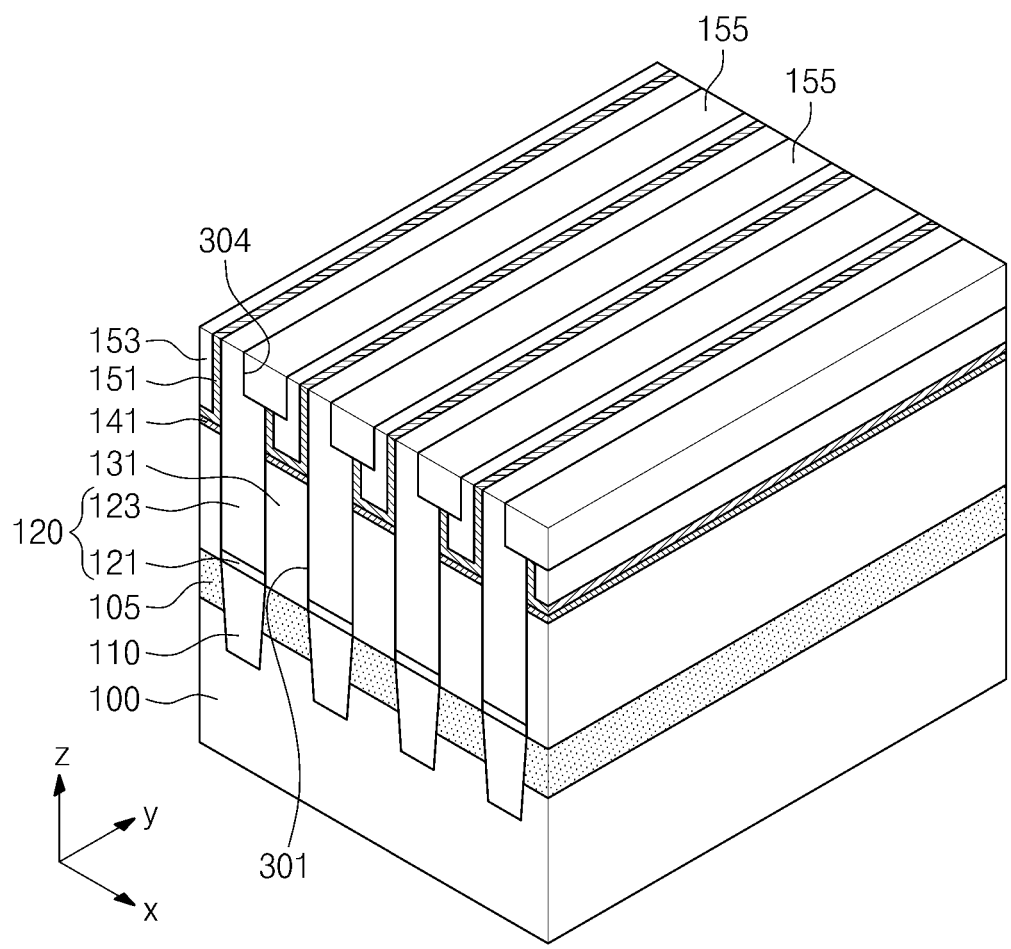

Referring to FIG. 16, upper trenches 304 may be formed to recess partially a top surface of the lower electrode layer 151. The upper trench 304 may be formed to be substantially parallel to the first trench 301.

As a result of the formation of the upper trenches 304, the lower electrode layer 151 may have a linear shape extending along the direction of the y-axis. The lower electrode layer 151 may include a bottom portion on the semiconductor layer 131 and sidewall portions extending upward from the bottom portion along the sidewall of the first insulating layer 123. Here, as a result of the formation of the upper trenches 304, the sidewall portions of the lower electrode layer 151 may be different from each other in terms of vertical length. The x-axis directional maximum width of the lower electrode layer 151 may be substantially equivalent to an upper width of the semiconductor layer 131.

The upper trench 304 may be filled with an insulating gap-filling layer 155, and then the insulating gap-filling layer 155 may be planarized to expose a top surface of the lower electrode layer 151. In some modified exemplary embodiments, the upper trench 304 may be filled with a first interlayer dielectric 145 (see FIGS. 8-10, 18, and 22) to be subsequently formed, without the insulating gap-filling layer 155.

Figure 17:
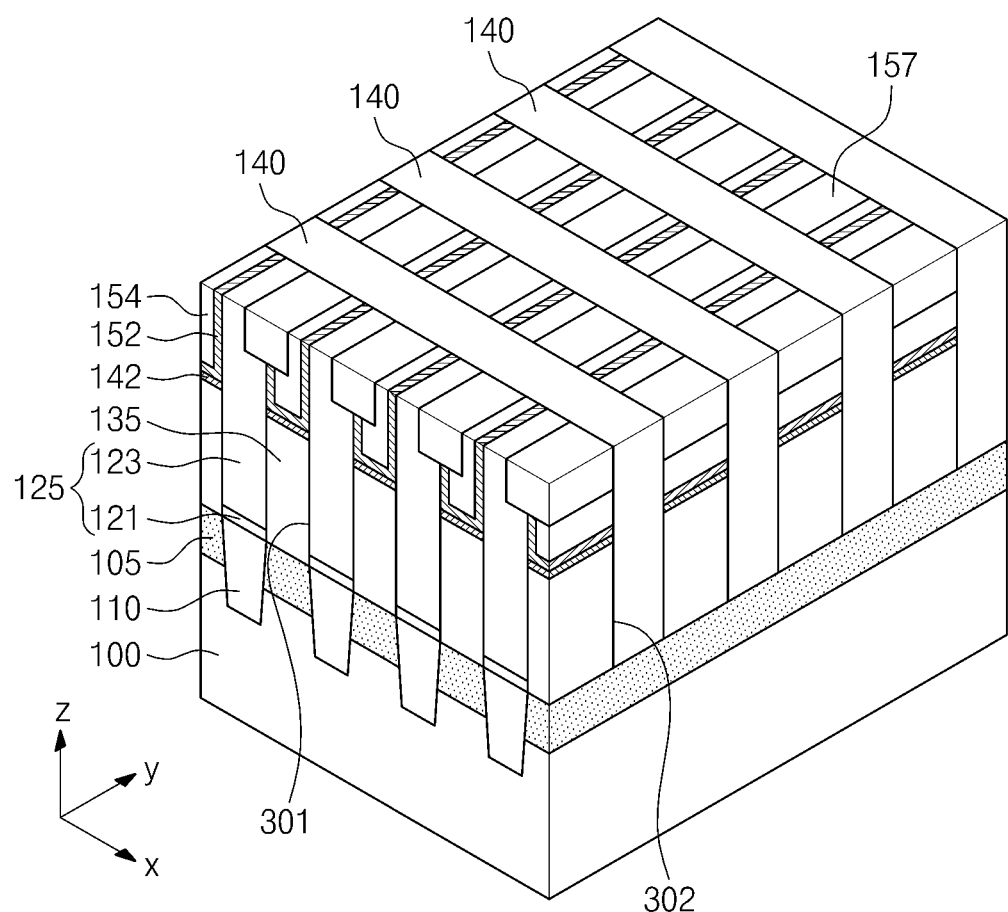

Referring to FIG. 17, the second trenches 302 may be formed to cross the mold patterns 120 and the semiconductor layers 131, as described with reference to FIG. 6. According to at least one exemplary embodiment, the formation of the second trenches 302 may include patterning the lower electrode layers 151 and the insulating gap-filling layer 155 to form lower electrodes 152, and then, patterning the mold patterns 120 and the semiconductor layers 131 to form the semiconductor patterns 135.

For example, the formation of the second trenches 302 may include forming a second mask pattern (not shown) having a line-and-space shape on the lower electrode layers 151 to cross the mold patterns 120 and the semiconductor layers 131, and then anisotropically etching the lower electrode layers 151 and the semiconductor layers 131 using the second mask pattern as an etch mask.

The second trenches 302 may be formed to extend along the direction of the y-axis. In addition, the second trenches 302 may be formed to expose the top surface of the semiconductor substrate 100. For example, the second trenches 302 may expose surfaces of the lower interconnection lines 105 formed by doping the semiconductor substrate 100 with impurities. Furthermore, the second trenches 302 may expose the etch stop layer 121 disposed below the first insulating layer 123. As the result of the anisotropic etching, a width of the second trench 302 may be smaller in a lower portion than in an upper portion. The second trench 302 may have a bottom surface that is recessed below the top surface of the semiconductor substrate 100.

As the result of the formation of the second trenches 302, the semiconductor patterns 135 may be two-dimensionally arranged on the semiconductor substrate 100, and the lower electrodes 152 may be disposed on the semiconductor patterns 135, respectively, as shown in FIG. 17. In addition, the ohmic patterns 142 may be interposed between the semiconductor patterns 135 and the lower electrodes 152, respectively, and the capping insulating patterns 154 may be formed on the lower electrodes 152, respectively. During the formation of the second trenches 302, the insulating gap-filling layer 155 in the recess region may be patterned to form gap-fill insulating patterns 157. According to at least one exemplary embodiment, similar to the semiconductor patterns 135, first sidewalls of the lower electrode 152 may be delimited by the first trenches 301, and second sidewalls of the lower electrode 152 may be delimited by the second trenches 302.

The lower electrode 152 may have a linear top surface. An x-axis directional width of the lower electrode 152 may be substantially equivalent to that of an upper portion of the semiconductor pattern 135, and a y-axis directional width of the lower electrode 152 may be substantially equivalent to that of the upper portion of the semiconductor pattern 135.

Thereafter, the second trenches 302 may be filled with the second insulating patterns 140. In other words, the second insulating patterns 140 may extend along the direction of the x-axis and cover the second sidewalls 135b (see FIGS. 6 and 12) of the semiconductor patterns 135 and the lower electrodes 152.

In at least one exemplary embodiment, the formation of the second insulating patterns 140 may include filling the second trenches 302 with an insulating material, and then, planarizing the insulating material to expose top surfaces of the gap-fill insulating pattern 157 and the lower electrode 152. The second insulating patterns 140 may be in direct contact with the sidewalls of the lower electrode 152 and the capping insulating pattern 154 exposed by the second trenches 302.

Figure 18:
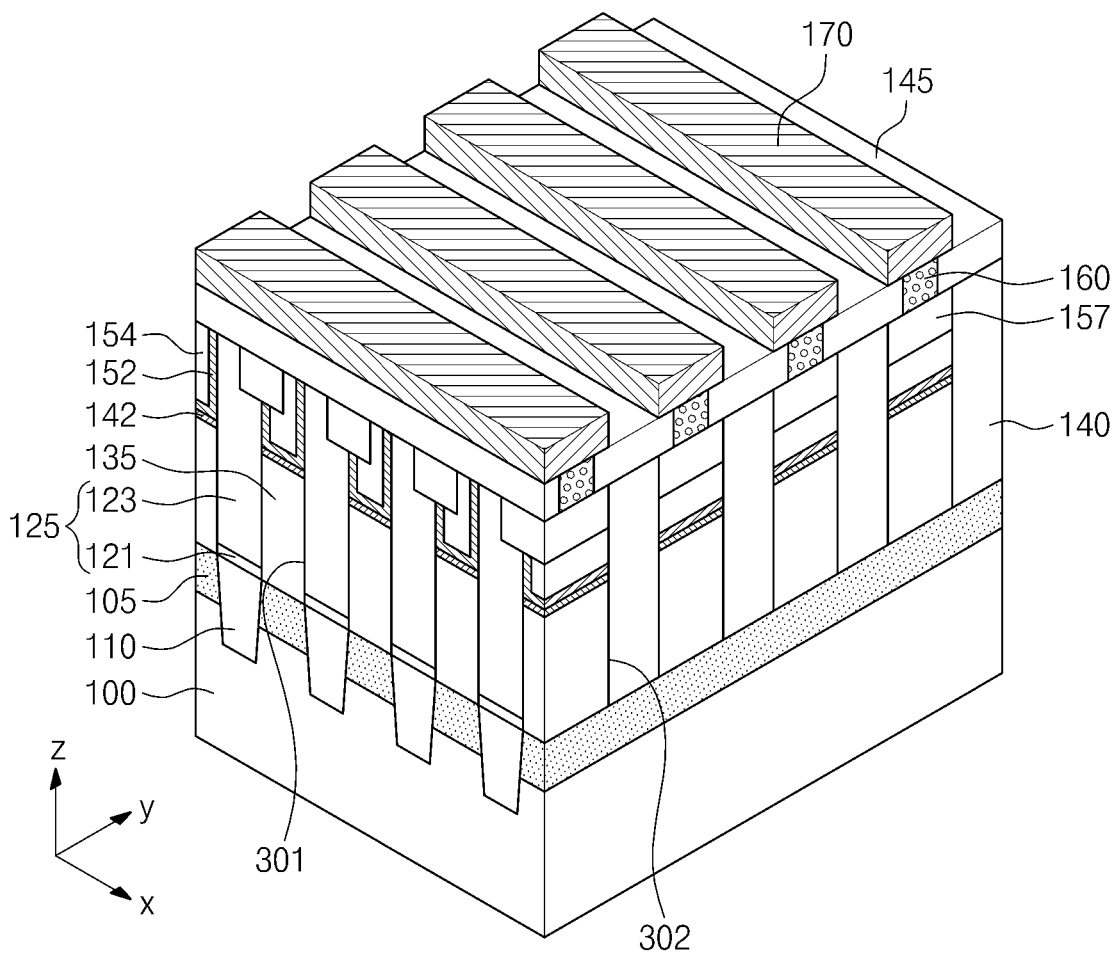

Referring to FIG. 18, the first interlayer dielectric 145 may be formed on the lower electrodes 152. The first interlayer dielectric 145 may be formed to define the openings crossing the lower interconnection lines 105 or the first trenches 301 and exposing top surfaces of the lower electrodes 152. The memory elements 160 may be formed in the openings of the first interlayer dielectric 145. Accordingly, each of the memory elements 160 may be shaped like a line crossing the lower interconnection lines 105.

The upper interconnection lines 170 may be formed on the memory elements 160 to cross the lower interconnection lines 105 or be parallel to the direction of the x-axis. In at least one exemplary embodiment, the upper interconnection lines 170 may be substantially parallel to the memory elements 160.

FIGS. 19 through 22 are perspective views illustrating a method of fabricating a semiconductor device according to modifications of other example embodiments of the present general inventive concept. These modifications may differ from at least one exemplary embodiment described with reference to FIGS. 14 through 18, in terms of the method of forming the capping insulating layer 153.

Figure 19:
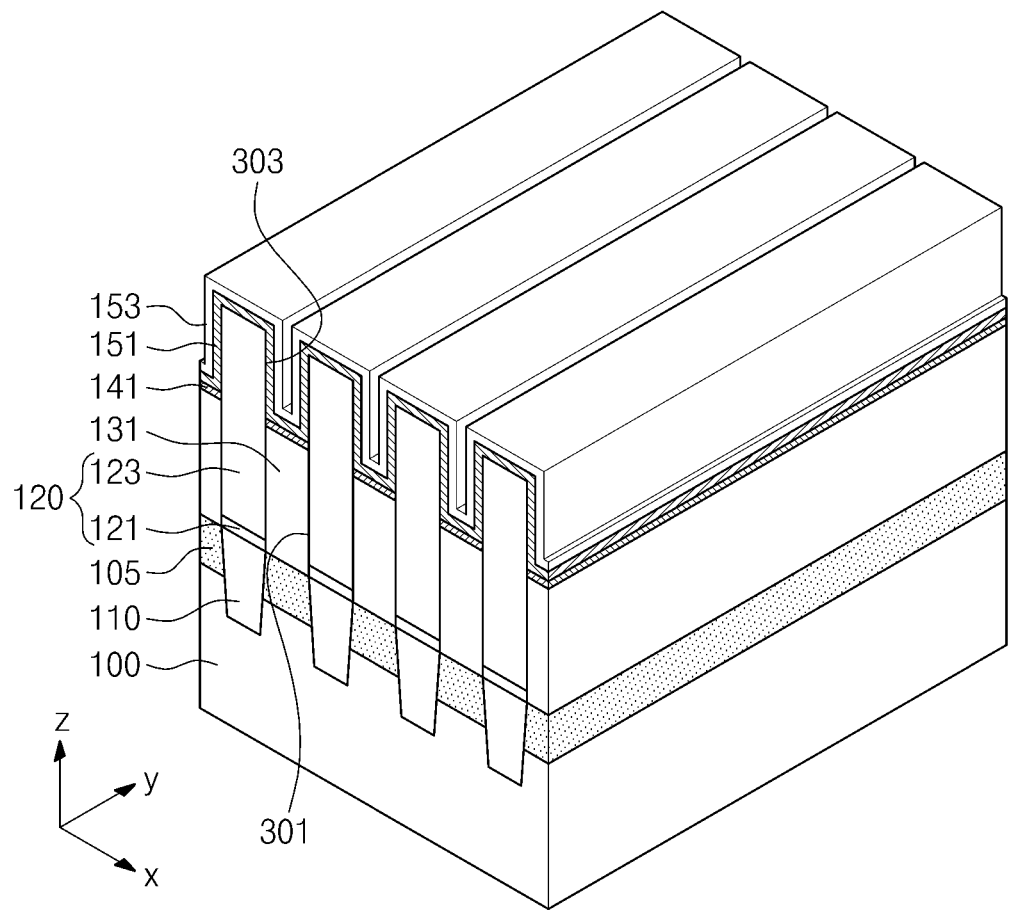
FIGS. 19 through 22 are perspective views illustrating a method of fabricating a semiconductor device according to modifications of other example embodiments of the present general inventive concepts.

Referring to FIG. 19, the top surfaces of the semiconductor layers 131 may be recessed to form the recess regions 303, as described with reference to FIG. 14. Next, the lower electrode layer 151 and the capping insulating layer 153 may be sequentially and conformally deposited on the structure including the recess regions 303.

Figure 20:
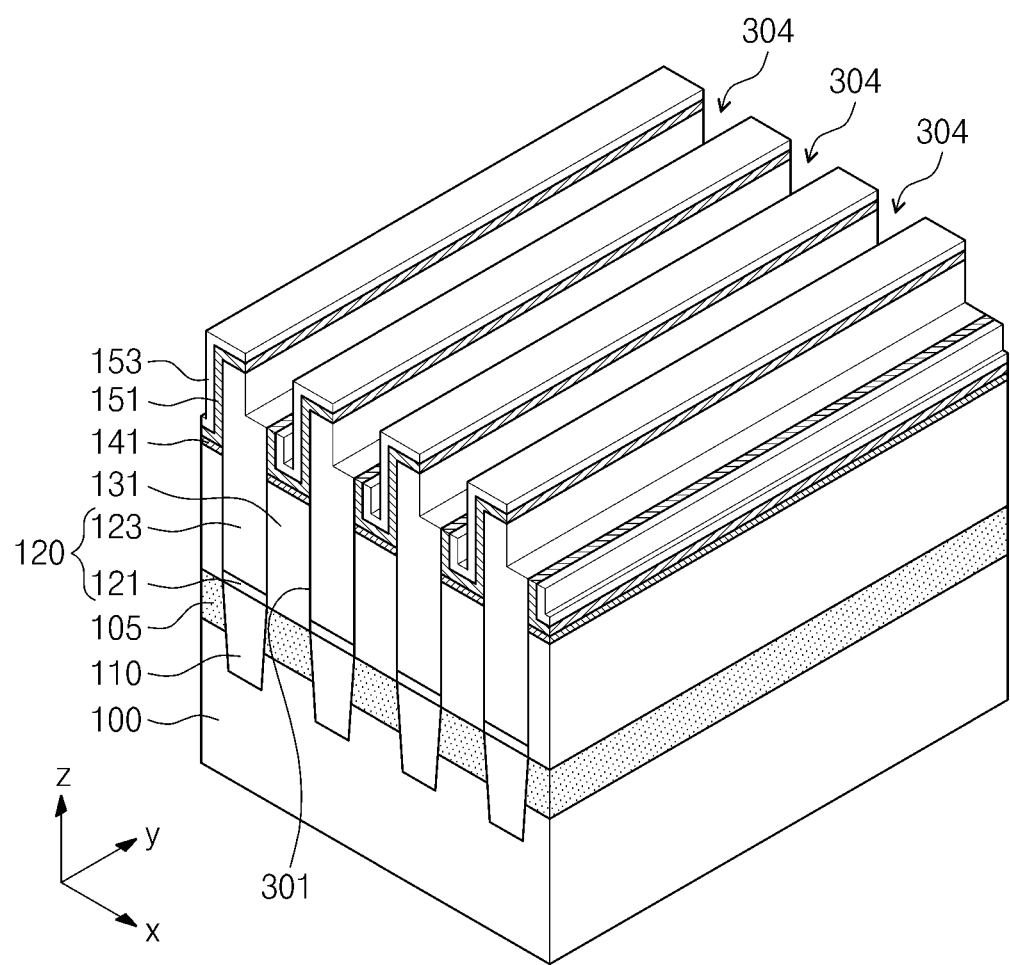

Here, a total deposition thickness of the lower electrode layer 151 and the capping insulating layer 153 may be smaller than half the width of the upper trench 304 (see FIGS. 16 and 20). In other words, the recess region 303 may have a portion that is not occupied by the lower electrode layer 151 and the capping insulating layer 153.

Referring to FIG. 20, the upper trenches 304 may be formed to recess partially the lower electrode layer 151. In at least one exemplary embodiment, the formation of the upper trenches 304 may include sequentially and partially etching the capping insulating layer 153 and the lower electrode layer 151 in an anisotropic etching manner. The upper trenches 304 may be formed to be substantially parallel to the first trench 301. Due to the presence of the upper trenches 304, the lower electrode layers 151 and the capping insulating layers 153 may have line shapes extending along the direction of the y-axis, and top surfaces of the first insulating layers 123 may be partially covered with the lower electrode layers 151 and the capping insulating layers 153.

Figure 21:
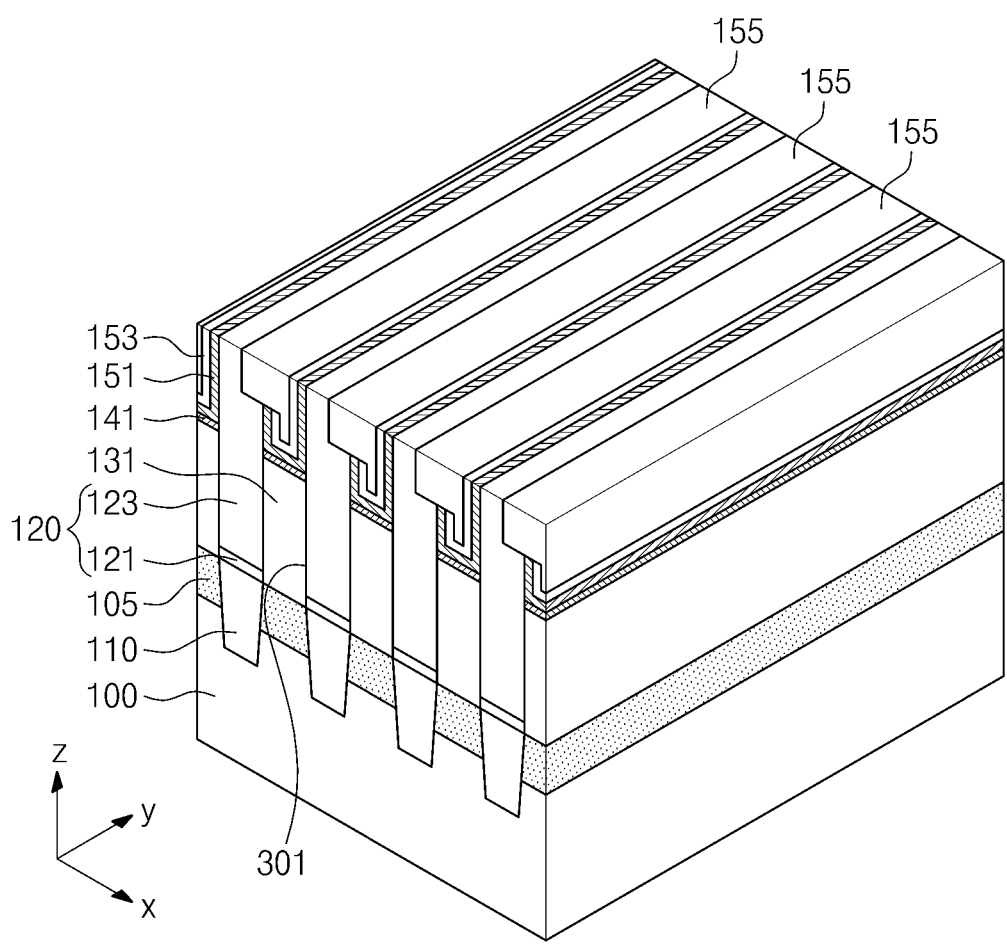

Referring to FIG. 21, the insulating gap-filling layers 155 may be formed to fill the upper trenches 304 (see FIG. 20) and the recess regions 303 (see FIG. 19). In at least one exemplary embodiment, the insulating gap-filling layer 155 may cover the top surface of the capping insulating layer 153. Thereafter, the insulating gap-filling layer 155 may be planarized to expose the top surfaces of the first insulating layers 123. During this process, the capping insulating layer 153 and the lower electrode layer 151 may be also planarized and localized in the recess region 303. As a result, a top surface of the lower electrode layer 151 may be shaped like a line extending along the direction of the y-axis. Along the direction of the z-axis, the lower electrode layer 151 may include a bottom portion on the semiconductor layer 131 and sidewall portions extending upward from the bottom portion along the sidewall of the first insulating layer 123. In at least one exemplary embodiment, the x-axis directional maximum width of the lower electrode layer 151 may be substantially equivalent to an x-axis directional upper width of the semiconductor layer 131. The capping insulating layer 153 may be formed in the recess region 303 to cover conformally the top surface of the lower electrode layer 151.

Figure 22:
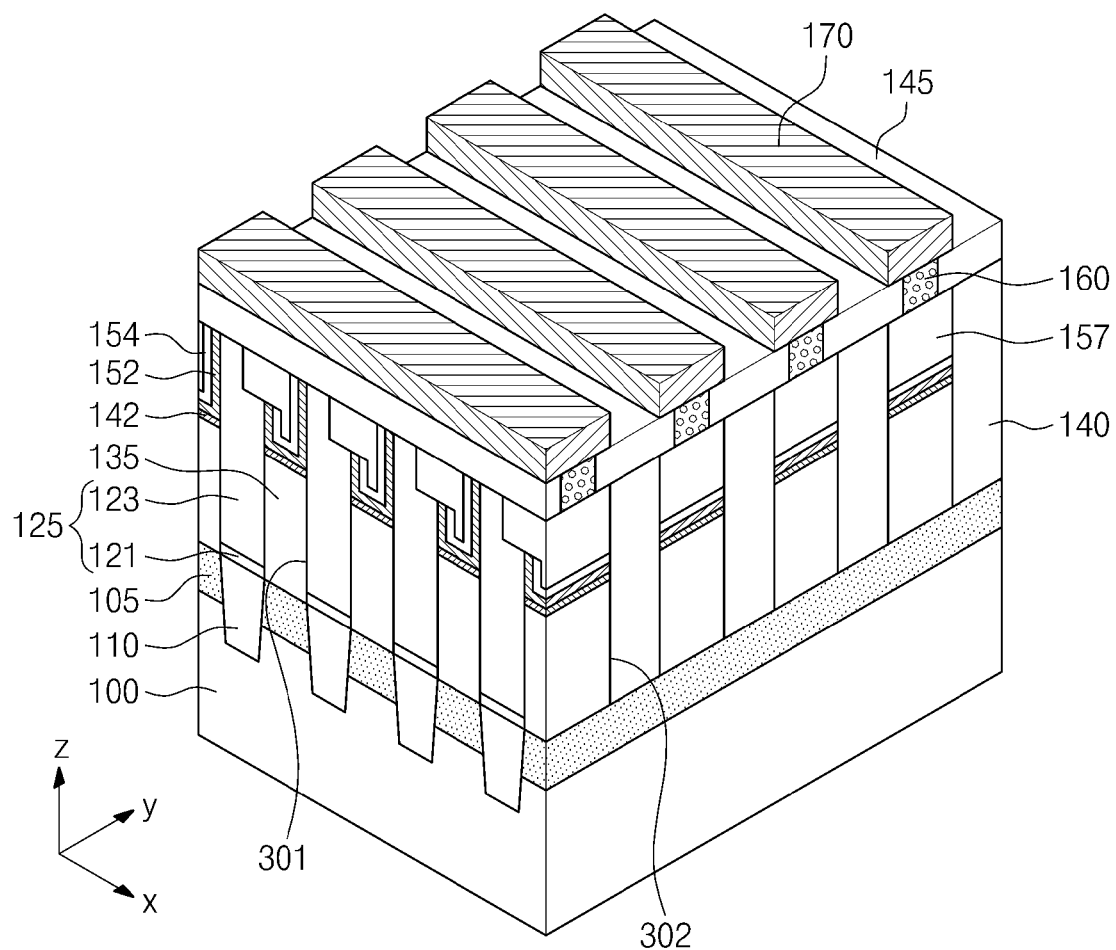

Referring to FIG. 22, the second trenches 302 may be formed to cross the mold patterns 120 and the semiconductor layers 131. As a result, the semiconductor patterns 135 may be two-dimensionally arranged on the semiconductor substrate 100, and the lower electrodes 152 may be formed on the semiconductor patterns 135, respectively. In addition, the ohmic patterns 142 may be interposed between the semiconductor patterns 135 and the lower electrodes 152, respectively, and the capping insulating patterns 154 may be formed on the lower electrodes 152, respectively. During the formation of the second trenches 302, the insulating gap-filling layer 155 in the recess region may be patterned to form gap-fill insulating patterns 157.

Thereafter, the first interlayer dielectric 145 may be formed to define the openings crossing the lower interconnection lines 105 or the first trenches 301 and exposing top surfaces of the lower electrodes 152, as previously described with reference to FIG. 18. The memory elements 160 may be formed in the openings of the first interlayer dielectric 145, and the upper interconnection lines 170 may be formed on the memory elements 160.

Hereinafter, the semiconductor device fabricated by the afore-described method will be described with reference to FIG. 22. For concise description, a previously described element may be identified by an identical reference number without repeating an overlapping description thereof.

Referring to FIG. 22, the semiconductor device may include the semiconductor substrate 100, the lower interconnection lines 105 on the semiconductor substrate 100, the upper interconnection lines 170 crossing the lower interconnection lines 105, the selection elements disposed at intersections, respectively, of the lower and upper interconnection lines 105 and 170, and the memory elements 160 interposed between the selection elements and the upper interconnection lines 170.

The selection elements may include the semiconductor patterns 135 formed by the forming method described with reference to FIGS. 14 through 18. Each of the semiconductor patterns 135 may include the upper and lower doped regions 135p and 135n (see FIGS. 7-10, 12, and 13), and the lower electrodes 152 may be formed between the semiconductor patterns 135 and the memory elements 160, respectively. The semiconductor patterns 135 may be cut by the first and the second trenches 301 and 302, such that they may be spaced apart from each other in both of the directions of the x- and y-axes or be two-dimensionally arranged on the semiconductor substrate 100. Here, each of the semiconductor patterns 135 may have the first sidewalls 135a (see FIGS. 6 and 12) delimited by the first trenches 301 to face each other and the second sidewalls 135a (see FIGS. 6 and 12) delimited by the second trenches 302 to face each other. Each of the semiconductor patterns 135 may have a substantially irregular quadrilateral shape in a planar sectional view.

Referring to the exemplary embodiment illustrated in FIG. 12, for each of the semiconductor patterns 135, if a first lower width W1 and a first upper width W2 are measured in a vertical section parallel to the direction of the x-axis or are given as distances between the first sidewalls 135a, the first lower width W1 may be smaller than the first upper width W2. Furthermore, for each of the semiconductor patterns 135, if a second lower width L1 and a second upper width L2 are measured in a vertical section parallel to the direction of the y-axis or are given as distances between the second sidewalls 135b, the second upper width L2 may be smaller than the second lower width L1.

Referring to FIG. 22, in at least one exemplary embodiment, the lower electrodes 152 may have first and second sidewalls delimited by the first and second trenches 301 and 302, respectively.

In a vertical sectional view, each of the lower electrodes 152 may include the bottom portion on the semiconductor pattern 135 and the sidewall portions extending upward from the bottom portion along the sidewall of the first insulating pattern 125. Here, the sidewall portions of the lower electrodes 152 may be different from each other in terms of vertical length. The top surface of the lower electrode 152 in contact with the memory element 160 may have a linear shape, in a plan view. For example, a longitudinal direction of the top surface of the lower electrode 152 may be substantially parallel to one of the lower interconnection line 105 and the upper interconnection line 170. In at least one exemplary embodiment, the longitudinal length of the lower electrode 152 may be substantially equivalent to the second upper width L2 of the second sidewall 135b of the semiconductor pattern 135 (see FIG. 12).

Furthermore, the capping insulating layers 153 may be disposed on the lower electrodes 152, respectively. Each of the capping insulating layers 153 may cover the bottom and sidewall portions of the lower electrode 152, as shown in FIGS. 18 and 22, and be in direct contact with the sidewalls of the second insulating pattern 140.

Figure 23:
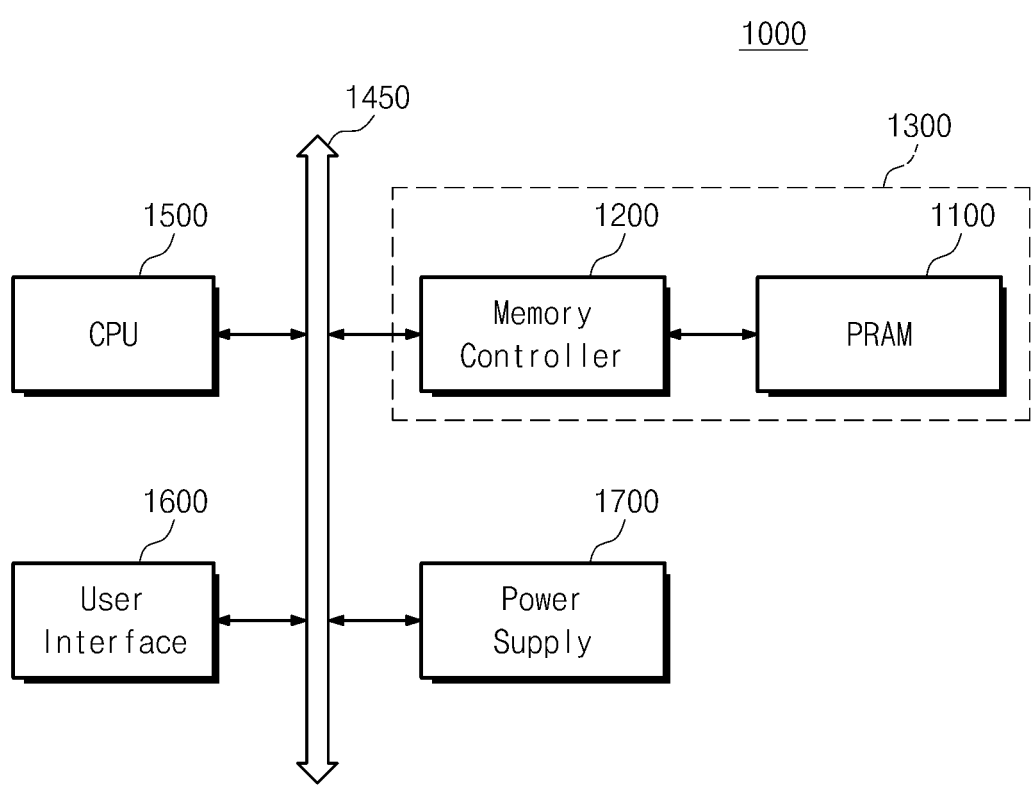
FIG. 23 is a block diagram of an electronic device including a semiconductor device according to embodiments of the present general inventive concepts.

FIG. 23 is a block diagram of an electronic device 1000 including a semiconductor device according to example embodiments of the present general inventive concept.

The electronic device 1000 according to example embodiments of the present general present general inventive concept may be used in various applications and/or devices including, but not limited to, an application chipset, a camera image sensor, a camera image signal processor (ISP), a personal digital assistant (PDA), a laptop computer, a portable computer, a web tablet, a wireless phone, a mobile phone, a digital music player, and a wired and/or wireless electronic device.

Referring to FIG. 23, the electronic device 1000 may include a semiconductor memory device 1300, a central processing unit (CPU) 1500, a user interface 1600, and a power supply device 1700, which are connected to a system bus 1450. The semiconductor memory device 1300 may include a semiconductor device 1100, which may be one of the semiconductor devices described previously with reference to FIGS. 1 through 22, and a memory controller 1200.

Data processed by the CPU 1500 and/or input from the user interface 1600 may be stored in the semiconductor device 1100, and the memory controller 1200 may be configured to control such data exchange among the CPU 1500, the user interface 1600, and the semiconductor device 1100. The semiconductor memory device 1100 may constitute a solid state drive (SSD), and in this case, an operating speed of the electronic device 1000 may become very fast.

A semiconductor pattern is used to realize a selection element. According to the afore-described exemplary embodiments of the present general present general inventive concept, the semiconductor pattern may be formed by patterning a semiconductor layer of linear shape. This may reduce a variation in width of the semiconductor pattern, even in the case in which integration density of the semiconductor device is very high. As a result, it is possible to fabricate semiconductor devices having an increased integration density and an improved operation property (e.g., reliability).

Although a few exemplary embodiments of the present general inventive concept have been shown and described, it will be appreciated by those skilled in the art that changes may be made in these exemplary embodiments without departing from the principles and spirit of the general inventive concept, the scope of which is defined in the appended claims and their equivalents.

What is claimed is:

1. A semiconductor device, comprising:
lower interconnection lines, upper interconnection lines crossing the lower interconnection lines, selection elements disposed at intersections, respectively, of the lower and upper interconnection lines, and memory elements interposed between the selection elements and the upper interconnection lines, respectively,
wherein each of the selection elements is realized using a semiconductor pattern having a first sidewall, in which a first lower width is smaller than a first upper width, and a second sidewall, in which a second lower width is greater than a second upper width, the first and second sidewalls crossing each other.

2. The semiconductor device of claim 1, wherein the semiconductor pattern is formed of an epitaxially grown single-crystalline semiconductor layer.

3. The semiconductor device of claim 1, wherein the semiconductor substrate comprises cell array regions and a contact region interposed between the cell array regions, and
wherein the device further comprises:
a pad semiconductor pattern including a lower doped region and an upper doped region disposed on the contact region, the lower and upper doped regions having different conductivity types from each other, and
a contact plug partially penetrating the pad semiconductor pattern to be connected to the lower doped region.

4. The semiconductor device of claim 1, wherein each of the semiconductor patterns comprises an upper doped region and a lower doped region, each of the upper and lower doped regions having different conductivity types from each other to form the selection element as at least one of a PN diode or a PIN diode.

5. The semiconductor device of claim 1, wherein the memory element contains at least one material selected from the group consisting of chalcogenide compounds, perovskite compounds, transition metal oxides, ferromagnetic materials, or antiferromagnetic materials.

6. The semiconductor device of claim 1, further comprising,
- first insulating patterns interposed between the semiconductor patterns adjacent to each other in a first direction to cover the first sidewalls of the semiconductor patterns; and
- second insulating patterns interposed between the semiconductor patterns adjacent to each other in a second direction to cover the second sidewalls of the semiconductor patterns and sidewalls of the first insulating patterns, the second direction being perpendicular to the first direction.

7. The semiconductor device of claim 6, further comprising,
- lower electrodes, each of which include a bottom portion on the semiconductor pattern and sidewall portions extending upward from the bottom portion along the sidewall of the first insulating pattern, the sidewall portions being different from each other in terms of vertical length; and
- capping insulating patterns covering the lower electrodes and being in direct contact with the second insulating pattern.

8. The semiconductor device of claim 6, further comprising, lower electrodes interposed between the semiconductor patterns and the memory elements, respectively,
- wherein each of the lower electrodes has a top surface that is in direct contact with the memory element and have a linear shape in plan view.

9. The semiconductor device of claim 8, wherein a longitudinal axis of the top surface of the lower electrode is parallel to one of the lower and upper interconnection lines, and a longitudinal length of the lower electrode is substantially equivalent to the second upper width of the semiconductor pattern.

10. A semiconductor memory device, comprising:
- a substrate region extending along a lengthwise direction that defines a length of the semiconductor memory device and a widthwise direction that defines a width of the semiconductor memory device;
- a memory region including a plurality of first connection lines extending along the widthwise direction, each first connection line having a memory element formed thereon and extending along the widthwise direction for substantially the width of the semiconductor memory device;
- a lower connection region including a plurality of second connection lines extending in the lengthwise direction and transverse to the memory element and the first connection lines;
- a plurality of selection elements disposed between the memory elements and the second connection lines, each of the plurality of selection elements having a first shape; and
- a plurality of insulation elements having a second shape that is inversely shaped with respect to the first shape of the plurality of selection elements,
- wherein the first shape has a first lower width which is greater than a first upper width, in the widthwise direction, and a second lower width which is smaller than a second upper width, in the lengthwise direction.

11. The semiconductor device of claim 10, further comprising:
- a plurality of third connection lines disposed above the first connection lines and extending in the lengthwise direction parallel with the second connection lines; and
- a contact element to electrically connect a third connection line among the plurality of third connection lines to a respective second connection line among the plurality of second connection lines.

12. The semiconductor memory device of claim 10, wherein each insulation element among the plurality of insulation elements is disposed between two selection elements among the plurality of selection elements.

13. The semiconductor memory device of claim 12, wherein each selection element includes a first upper portion and a first lower portion that is smaller than the first upper portion, and each insulation element includes a second upper portion and a second lower portion that is greater than the second upper portion.

14. The semiconductor device of claim 13, wherein the first upper portion of each selection element is doped with first impurities and the first lower portion of each selection element is doped with second impurities different from the first impurities.

* * * * *